United States Patent
Lim et al.

(10) Patent No.: US 9,515,647 B2
(45) Date of Patent: Dec. 6, 2016

(54) GATE CIRCUIT AND DISPLAY DEVICE USING THE SAME

(71) Applicant: Samsung Display Co., Ltd., Yongin, Gyeonggi-Do (KR)

(72) Inventors: Jae Keun Lim, Suwon-si (KR); Hyun Joon Kim, Yongin-si (KR); Cheol-Gon Lee, Seoul (KR); Chong Chul Chai, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 16 days.

(21) Appl. No.: 14/565,553

(22) Filed: Dec. 10, 2014

(65) Prior Publication Data

US 2015/0356909 A1    Dec. 10, 2015

(30) Foreign Application Priority Data

Jun. 9, 2014    (KR) ........................ 10-2014-0069513

(51) Int. Cl.
*G09G 3/36*    (2006.01)
*H03K 17/16*    (2006.01)

(52) U.S. Cl.
CPC .......... *H03K 17/162* (2013.01); *G09G 3/3677* (2013.01); *G09G 2300/0426* (2013.01); *G09G 2310/0267* (2013.01); *G09G 2310/0286* (2013.01); *G09G 2310/08* (2013.01)

(58) Field of Classification Search
CPC ............. G06F 3/038; G09G 5/00; G09G 3/36; G11C 19/00; G11C 19/28; H03K 23/46; H03K 21/08; H03K 21/02; G06M 1/00
See application file for complete search history.

(56) References Cited

U.S. PATENT DOCUMENTS

| | | | | |
|---|---|---|---|---|
| 2008/0001904 A1* | 1/2008 | Kim | ...................... | G09G 3/3677 345/100 |
| 2009/0040203 A1* | 2/2009 | Kim | ...................... | G09G 3/3677 345/204 |
| 2013/0181747 A1* | 7/2013 | Yoon | ..................... | G11C 19/184 327/108 |
| 2014/0092078 A1 | 4/2014 | Yoon et al. | | |

FOREIGN PATENT DOCUMENTS

| | | |
|---|---|---|
| CN | 103714789 | 4/2014 |
| EP | 2713361 | 4/2014 |
| JP | 2014071452 | 4/2014 |

(Continued)

*Primary Examiner* — Pegeman Karimi
(74) *Attorney, Agent, or Firm* — Cantor Colburn LLP

(57) ABSTRACT

A gate driver includes a stage including an input unit including a first transistor diode-connected to a first input terminal of the stage through a first node and biased by a first input signal of the first input terminal, an output unit including a second transistor including a gate electrode coupled to the first node, a first electrode coupled to a clock input terminal, and a second electrode coupled to a first output terminal of the stage, a capacitor coupled between the gate electrode and the second electrode of the second transistor, and a noise remover including a third transistor including a gate electrode coupled to a second node, a first electrode coupled to the first node, and a second electrode coupled to a first voltage input terminal of the stage which receives a first voltage.

26 Claims, 11 Drawing Sheets

(56) References Cited

FOREIGN PATENT DOCUMENTS

| KR | 1020070074826 A | 7/2007 |
| KR | 1020090083199 A | 8/2009 |
| KR | 1020130028274 A | 3/2013 |
| KR | 1020130083151 A | 7/2013 |
| KR | 1020140042308 | 4/2014 |

* cited by examiner

GATE CIRCUIT AND DISPLAY DEVICE USING THE SAME

This application claims priority to Korean Patent Application No. 10-2014-0069513 filed on Jun. 9, 2014, and all the benefits accruing therefrom under 35 U.S.C. §119, the entire contents of which are incorporated herein by reference.

BACKGROUND (a) Field

The invention relates to a gate circuit and a display device using the same, and particularly, to a display having a gate driving circuit integrated therein.

(b) Description of the Related Art

In general, as one of the most widely used flat panel displays at present, liquid crystal displays ("LCDs") generally include two display panels on which field generating electrodes such as a pixel electrode and a common electrode are formed, and a liquid crystal layer interposed between the two display panels.

The LCDs display an image by generating an electric field on a liquid crystal layer by applying a voltage to the field generating electrodes, determining alignment directions of liquid crystal molecules of the liquid crystal layer through the generated field, and controlling polarization of incident light.

In addition to the LCDs, there are various other displays such as an organic light emitting diode ("OLED") display, a plasma display, an electrophoretic display, etc.

Such display devices generally include a gate driver and a data driver.

The gate driver may be integrated with the device by being patterned together with gate lines, data lines, thin film transistors, etc.

The gate driver integrated as described above has an advantage of reducing manufacturing cost, since there is no need to form an additional gate driving chip thereon.

SUMMARY

Since numerous transistors are inclined to improve reliability of a driving circuit of a large display device and to reduce a leakage current thereof, a size of the driving circuit is increased and yield of the driving circuit is decreased.

The invention has been made in an effort to provide a gate circuit and a display device using the same according to an exemplary embodiment that can reduce a size of a gate circuit and improve yields.

The invention prevents any problem from occurring even when a level of a gate voltage outputted from a gate driver installed in a display device is not decreased or a leakage current occurs.

Embodiments of the invention are not limited to the aforementioned concept, and other concepts not mentioned above will be apparently understood by a person of ordinary skill in the art to which the invention belongs, from the following description.

A gate driving circuit related to an exemplary embodiment includes a plurality of stages which respectively outputs gate signals to corresponding gate lines. A stage of the plurality of stages includes an input unit including a first transistor diode-connected to a first input terminal of the stage through a first node and biased by a first input signal of the first input terminal, an output unit including a second transistor including a gate electrode coupled to the first node, a first electrode coupled to a clock input terminal, and a second electrode coupled to a first output terminal of the stage, a capacitor coupled between the gate electrode and the second electrode of the second transistor, and a pull-down unit including a third transistor including a gate electrode coupled to a second first input terminal of the stage, a first electrode coupled to the first node, and a second electrode coupled to a first voltage input terminal of the stage which receives a first voltage. A second input signal of the second input terminal becomes an enable-level signal after a predetermined time is passed from a time when the second transistor outputs one cycle of the clock signal of the clock input terminal.

In an exemplary embodiment, the stage may further include a transfer signal generator including a fourth transistor including a gate electrode coupled to the first node, a first electrode coupled to the clock input terminal, and a second electrode coupled to a second output terminal of the stage.

In an exemplary embodiment, the stage may further include an inverter unit including a fifth transistor including a first electrode and a gate electrode coupled to the clock input terminal, and a second electrode that outputs the clock signal when being applied with the clock signal of the clock input terminal, a sixth transistor including the gate electrode coupled to the second electrode of the fifth transistor, a first electrode coupled to the clock input terminal, and a second electrode coupled to a second node, and a noise remover including a seventh transistor including a gate electrode coupled to the second node, a first electrode coupled to a second electrode of the second transistor, and a second electrode coupled to the first voltage input terminal.

In an exemplary embodiment, the noise remover may further include an eighth transistor including a gate electrode coupled to the second node, a first electrode coupled to the second output terminal, and a second electrode coupled to the first input terminal.

In an exemplary embodiment, the noise remover may further include a ninth transistor including a gate electrode coupled to the second node, a first electrode coupled to the first node, and a second electrode coupled to the first voltage input terminal.

In an exemplary embodiment, the inverter unit may further include a tenth transistor including a gate electrode coupled to the second output terminal, a first electrode coupled to the second node, and a second electrode coupled to the first voltage.

In an exemplary embodiment, the inverter unit may further include an eleventh transistor including a gate electrode coupled to the second node, a first electrode coupled to the first output terminal, and a second electrode coupled to the first node.

In an exemplary embodiment, the pull-down unit may further include a twelfth transistor including a gate electrode coupled to a third input terminal of the stage, a first electrode coupled to the second electrode of the third transistor, and a second electrode coupled to the first voltage input terminal, where a third input signal of the third input terminal may become the enable-level signal after the second transistor outputs one cycle of the clock signal of the clock input terminal.

In an exemplary embodiment, the predetermined time may be one fourth of a cycle of the clock signal.

In an exemplary embodiment, the second input signal may be outputted to a first output terminal of another stage, and may become the enable-level signal after the predetermined time is passed from the time when the second transistor outputs one cycle of the clock signal of the clock input terminal.

In an exemplary embodiment, the second input signal may be outputted to a second output terminal of another stage, and may become an enable-level signal after the predetermined time is passed from the time when the second transistor outputs one cycle of the clock signal of the clock input terminal.

In an exemplary embodiment, a first electrode of the third transistor may be directly coupled to the first node.

In an exemplary embodiment, the pull-down unit may further include a thirteenth transistor including a gate electrode coupled to a fourth input terminal of the stage, a first electrode coupled to first node, and a second electrode coupled to the first electrode of the third transistor, where a fourth input signal of the fourth input terminal may become the enable-level signal after the second transistor outputs one cycle of the clock signal of the clock input terminal.

A display device related to an exemplary embodiment includes a display unit including a plurality of pixels coupled to corresponding gate lines, and gate drivers including a plurality of stages which respectively outputs gate signals to the gate lines. A stage of the plurality of stages includes an input unit including a first transistor diode-connected to a first input terminal of the stage through a first node and biased by a first input signal of the first input terminal of the stage, an output unit including a second transistor including a gate electrode coupled to the first node, a first electrode coupled to a clock input terminal which receives a clock signal, and a second electrode coupled to a first output terminal of the stage, a capacitor coupled between the gate electrode and the second electrode of the second transistor, and a pull-down unit including a third transistor including a gate electrode coupled to a second input terminal of the stage, a first electrode coupled to the first node, and a second electrode coupled to a first voltage input terminal of the stage which receives a first voltage, where a second input signal of the second input terminal may become the enable-level signal after a predetermined time is passed from a time when the second transistor outputs one cycle of the clock signal of the clock input terminal.

In an exemplary embodiment, the stage may further include a transfer signal generator including a fourth transistor including a gate electrode coupled to the first node, a first electrode coupled to the clock input terminal, and a second electrode coupled to a second output terminal of the stage.

In an exemplary embodiment, the stage may further include an inverter unit including a fifth transistor including a first electrode and a gate electrode coupled to the clock input terminal, and a second electrode that outputs the clock signal when being applied with the clock signal of the clock input terminal, and a sixth transistor including a gate electrode coupled to the second electrode of the fifth transistor, a first electrode coupled to the clock input terminal, and a second electrode coupled to a second node, and a noise remover including a seventh transistor including a gate electrode coupled to the second node, a first electrode coupled to the second electrode of the second transistor, and a second electrode coupled to the first voltage input terminal.

In an exemplary embodiment, one of the noise remover may further include an eighth transistor including a gate electrode coupled to the second node, a first electrode coupled to the second output terminal, and a second electrode coupled to the first voltage input terminal.

In an exemplary embodiment, the noise remover may further include a ninth transistor including a gate electrode coupled to the second node, a first electrode coupled to the first node, and a second electrode coupled to the first voltage input terminal.

In an exemplary embodiment, the inverter unit may further include a tenth transistor including a gate electrode coupled to the second output terminal, a first electrode coupled to the second node, and a second electrode coupled to the first voltage input terminal.

In an exemplary embodiment, the inverter unit may further include an eleventh transistor including a gate electrode coupled to the second output terminal, a first electrode coupled to the second electrode of the fifth transistor, and a second electrode coupled to the first voltage input terminal.

In an exemplary embodiment, the pull-down unit may further include a twelfth transistor including a gate electrode coupled to a third input terminal of the stage, a first electrode coupled to the second electrode of the third transistor, and a second electrode coupled to the first voltage input terminal, and a third input signal of the third input terminal may become the enable-level signal after the second transistor outputs one cycle of the clock signal of the clock input terminal.

In an exemplary embodiment, the predetermined time may be one fourth of a cycle of the clock signal.

In an exemplary embodiment, the second input signal may be outputted to a first output terminal of another stage, and may become the enable-level signal after the predetermined time is passed from the time when the second transistor outputs one cycle of the clock signal of the clock input terminal.

In an exemplary embodiment, the second input signal may be outputted to a second output terminal of another stage, and may become the enable-level signal after the predetermined time is passed from the time when the second transistor outputs one cycle of the clock signal of the clock input terminal.

In an exemplary embodiment, a first electrode of the third transistor may be directly coupled to the first node.

In an exemplary embodiment, the pull-down unit may further include a thirteenth transistor including a gate electrode coupled to a third input terminal of the stage, a first electrode coupled to the second electrode of the third transistor, and a second electrode coupled to the first voltage input terminal, and a third input signal of the third input terminal may become the enable-level signal after the second transistor outputs one cycle of the clock signal of the clock input terminal.

Effects of the gate circuit and the display device using the same are as follows.

According to at least one of the exemplary embodiments of the invention, the number of transistors forming the gate circuit can be reduced, thereby having an advantage of reducing the size of the gate circuit.

In addition, according to at least one of the exemplary embodiments of the invention, a connection structure of the transistors of the gate circuit can be changed, thereby having an effect of decreasing power used by the gate driver as well as enhancing efficiency of integrating the circuit of the gate driver.

The above effects desired to be achieved in the invention are not limited to the aforementioned effects, and the invention includes other effects which are not described above but apparent to those skilled in the art.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
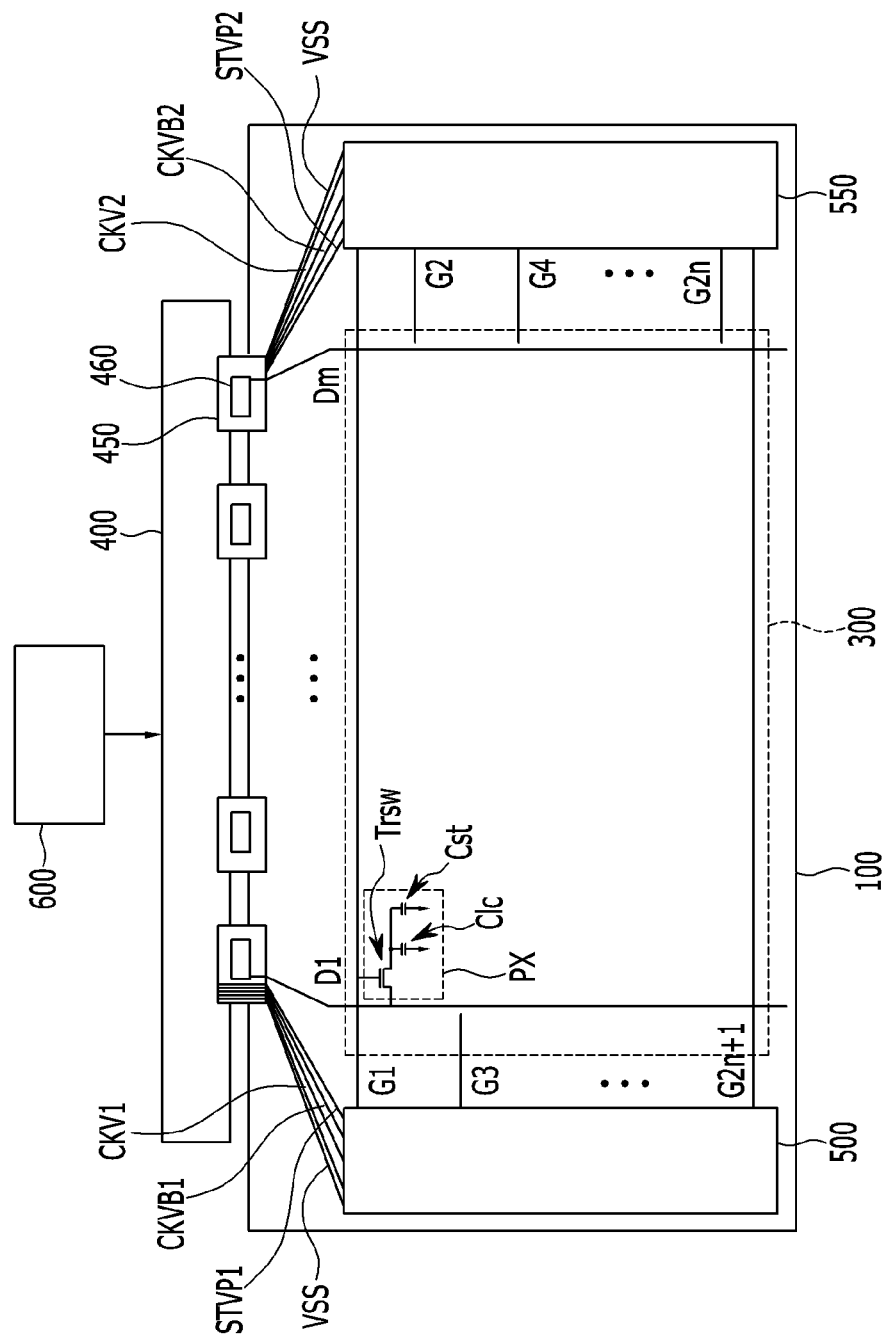
FIG. 1 is a top plan view of an exemplary embodiment of a display device according to the invention.

The invention will be described more fully hereinafter with reference to the accompanying drawings, in which exemplary embodiments of the invention are shown.

However, as those skilled in the art would realize, the described embodiments may be modified in various different ways, all without departing from the spirit or scope of the invention.

In addition, the drawings and description are to be regarded as illustrative in nature and not restrictive, and like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

In addition, the terms "-er", "-or", and "module" described in the specification mean units for processing at least one function and operation, and can be implemented by hardware components or software components and combinations thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the illustrated exemplary embodiments, it is assumed that transistors included in a display device are N-channel metal-oxide-semiconductor field-effect ("NMOS") transistors.

A display device according to an exemplary embodiment will now be described in detail with reference to FIG. 1.

FIG. 1 is a top plan view of a display device according to an exemplary embodiment.

Referring to FIG. 1, a display device 100 according to an exemplary embodiment includes a display area 300 for displaying an image, and first and second gate drivers 500 and 550 for supplying gate voltages to gate lines G1 to G2n+1 of the display area 300.

A data driver integrated chip ("IC") 460 for supplying data voltages to data lines D1 to Dm of the display area 300 may be disposed on a film such as a flexible printed circuit ("FPC") film 450.

The data driver IC 460, the first gate driver 500, and the second gate driver 550 are controlled by a signal controller 600.

The FPC film 450 is electrically coupled to a printed circuit board ("PCB") 400, and signals from the signal controller 600 may be transmitted to the data driver IC 460, the first gate driver 500, and the second gate driver 550 through the PCB 400 and the FPC film 450.

As signals provided by the signal controller 600, there are a first clock signal CKV1, a second clock signal CKVB1, a third clock signal CKV2, a fourth clock signal CKVB2, scan start signals STVP1 and STVP2, and a signal for supplying a specific level of low voltage VSS.

The display area 300 includes a plurality of pixels PX.

In an exemplary embodiment, when the display device 100 is a liquid crystal display ("LCD"), for example, each pixel PX includes a thin film transistor ("TFT") Trsw, a liquid crystal capacitor Clc, and a storage capacitor Cst.

A gate electrode of the TFT Trsw is coupled to one gate line, a first electrode of the TFT Trsw is coupled to one data line, and the second electrode of the TFT Trsw is coupled to a first electrode of the liquid crystal capacitor Clc and a first electrode of the storage capacitor Cst.

A second electrode of the liquid crystal capacitor Clc is coupled to a common electrode, and a second electrode of the storage capacitor Cst is applied with a storage voltage Vcst that is applied from the signal controller 600.

There are various exemplary embodiments for a structure of the pixel PX of the LCD, and the invention may include a pixel PX having an additional configuration in addition to a basic structure of the pixel PX illustrated in FIG. 1.

In FIG. 1, a case in which the display device 100 is an LCD is exemplarily described, but the invention is not limited thereto, and the pixel PX may include a TFT and an organic light emitting diode ("OLED") when the display device 100 is an OLED display, and in other types of display devices, the display area 300 may be provided to include a TFT and the like.

The invention is not limited to the LCD, but for clarity of the description, the LCD will be exemplarily described.

The display area 300 includes a plurality of gate lines G1 to G2n+1 and a plurality of data lines D1 to Dm, and the plurality of gate lines G1 to G2n+1 and the plurality of data lines D1 to Dm cross each other while being insulated from each other, where n is a natural number.

The data driver IC 460 is provided at an upper or lower part of the display device 100 and is coupled to the data lines D1 to Dm that extend in a substantially vertical direction, and an exemplary embodiment in which the data driver IC 460 is disposed at the upper part of the display device 100 is illustrated in the exemplary embodiment of FIG. 1.

The first and second gate drivers 500 and 550 may be respectively provided at left and right sides of the display device 100 in a plan view.

When being applied with the first clock signal CKV1, the second clock signal CKVB1, a first scan start signal STVP1, and the low voltage VSS, the first gate driver 500 generates a gate voltage including a gate-on voltage or gate-off voltage, and sequentially applies the gate voltage to odd-numbered gate lines (e.g., G1, G3, . . . , and G2n+1).

When being applied with the third clock signal CKV2, the fourth clock signal CKVB2, a second scan start signal STVP2, and the low voltage VSS, the second gate driver 550 generates the gate voltage including a gate-on voltage or gate-off voltage, and sequentially applies the gate voltage to even-numbered gate lines G2, G4, . . . , and G2n.

That is, the display device 100 according to the exemplary embodiment may have an interlaced structure in which the first gate driver 500 for applying the gate voltage to the odd-numbered gate lines (e.g., G1, G3, . . . , and G2n+1) is provided at the left side of the display device 100 while the second gate driver 550 for applying the gate voltage to the even-numbered gate lines (e.g., G2, G4, . . . , and G2n) is provided at the right side of the display device 100.

In the above description, an overall structure of the display device 100 according to the exemplary embodiment has been described.

Figure 2:
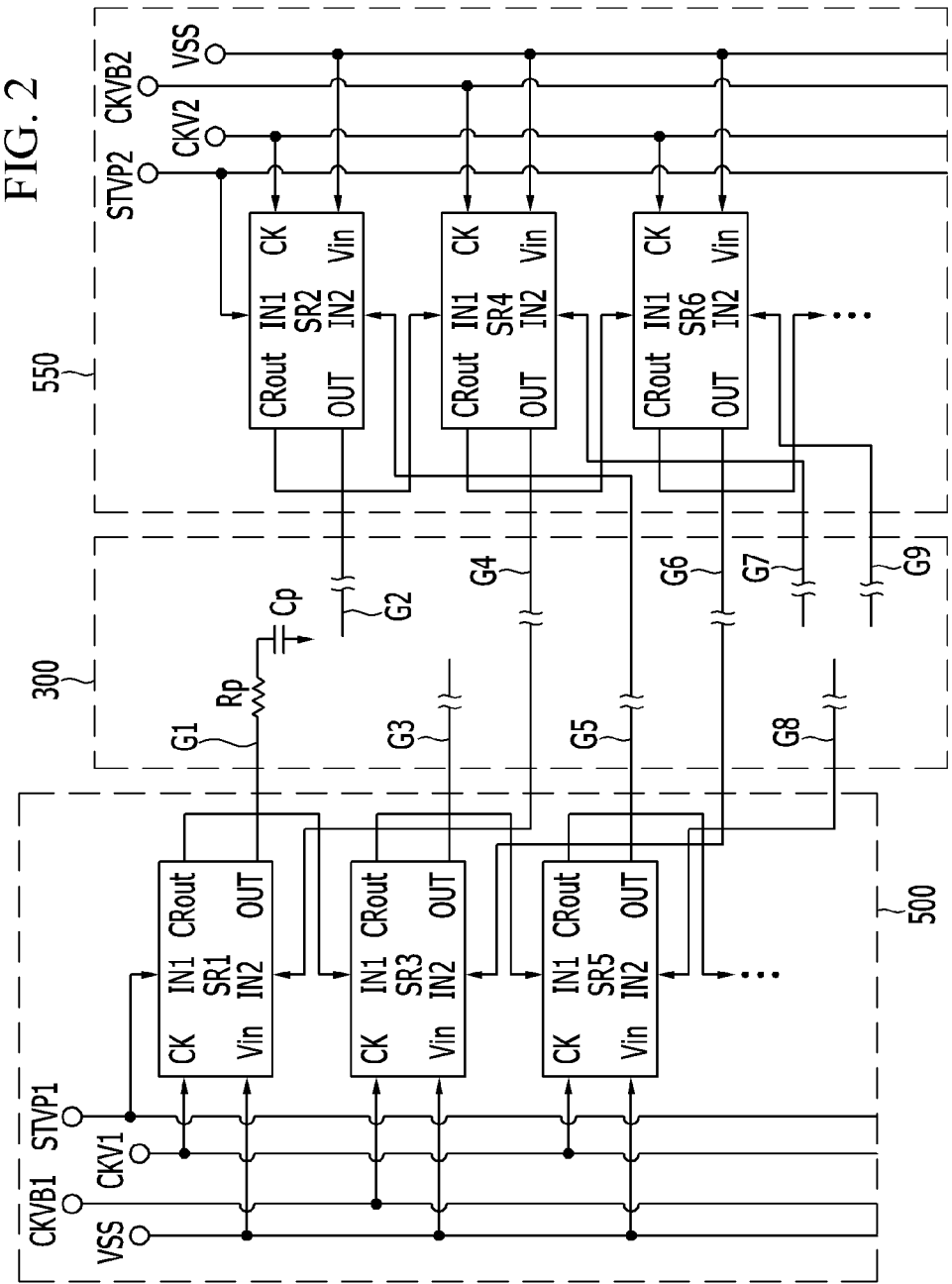
FIG. 2 is a block diagram specifically illustrating one exemplary embodiment of a first gate driver, a second gate driver, and gate lines according to the exemplary embodiment of FIG. 1.

FIG. 2 is a block diagram specifically illustrating one exemplary embodiment of a first gate driver, a second gate driver, and gate lines according to an exemplary embodiment of FIG. 1.

In FIG. 2, the display area 300 is shown as an area including a parasitic resistance Rp and a parasitic capacitance Cp.

Herein, the resistance Rp of the gate lines G1 to G2n+1 and the parasitic capacitance Cp coupled thereto are equivalently shown.

The first and second gate drivers 500 and 550 will now be described.

The first and second gate drivers 500 and 550 respectively include odd-numbered stages (e.g., SR1, SR3, SR5, . . . ) and even-numbered stages (e.g., SR2, SR4, SR6, . . . ).

In the illustrated exemplary embodiment, the first gate driver 500 includes the odd-numbered stages (e.g., SR1, SR3, . . . , and SR2n+1) that respectively correspond to the odd-numbered gate lines (e.g., G1, G3, . . . , and G2n+1), and the second gate driver 550 includes the even-numbered stages (e.g., SR2, SR4, . . . , and SR2n) that respectively correspond to the even-numbered gate lines (e.g., G2, G4, . . . , and G2n), for example.

Each of the stages (e.g., SR1, SR2, SR3, SR4, SR5, SR6 . . . ) includes two input terminals IN1 and IN2, one clock input terminal CK, a voltage input terminal Vin, a gate voltage output terminal OUT for outputting the gate voltage, and a transfer signal output terminal CRout.

The first input terminals IN1 of the odd-numbered stages other than the first odd-numbered state SR1 (e.g., SR3, SR5 . . . ) included in the first gate driver 500 are coupled to the transfer signal output terminals CRout of the previous odd-numbered stages, and are applied with the transfer signals CR of the previous odd-numbered stages. The first input terminal IN1 of the first odd-numbered state SR1 is applied with the first scan start signal STVP1 because the first odd-numbered stage SR1 does not have a previous odd-numbered stage.

The first input terminals IN1 of the even-numbered stages other than the first even-numbered stage SR2 (e.g., SR4, SR6 . . . ) included in the second gate driver 550 are coupled to the transfer signal output terminals CRout of the previous even-numbered stages and are applied with the transfer signal CR of the previous even-numbered stage, and the first input terminal IN1 of the first even-numbered stage SR2 is applied with the second scan start signal STVP2 because the first even-numbered stage SR2 does not have a previous odd-numbered stage.

In this case, timing of the first scan start signal STVP1 applied to the first odd-numbered stage SR1 and timing of the second scan start signal STVP2 applied to the first even-numbered stage SR2 may be continuous, for example.

In an exemplary embodiment, the first scan start signal STVP1 may be turned on earlier than the second scan start signal STVP2 by a quarter cycle of the clock signal, for example.

The second input terminal IN2 of the k-th stage receives the gate voltage that is outputted from the gate voltage output terminal OUT of the (k+3)-th stage, where k is a natural number.

In an exemplary embodiment, the second input terminals IN2 of the odd-numbered stages SR1, SR3, SR5 . . . are respectively coupled to the gate lines that are coupled to the gate voltage output terminals OUT of the even-numbered stages SR4, SR6, SR8, . . . so as to be applied with the gate voltage, for example.

Similarly, the second input terminals IN2 of the even-numbered stages SR2, SR4, SR6 . . . are respectively coupled to the gate lines that are coupled to the gate voltage output terminals OUT of the odd-numbered stages SR5, SR7, SR9 . . . so as to be applied with the gate voltage.

The stage SR2n−1 (not shown) coupled to the (2n−1)-th gate line G2n−1, the stage SR2n (not shown) coupled to the 2n-th gate line G2n, and the stage SR2n+1 (not shown) coupled to the (2n+1)-th gate line G2n+1 may be provided as dummy stages for applying the gate voltage.

Unlike the other stages SR1 to SR2n−2, the dummy stages SR2n−1, SR2n, and SR2n+1 refer to the stages for generating and then outputting a dummy gate voltage.

Each gate voltage outputted from the stages SR1 to SR2n−2, excluding the dummy stages, is transmitted to the pixel through the gate line, thereby displaying an image according to the data voltage.

The second input terminal of the stage SR2n−4 (not shown) coupled to the (2n−4)-th gate line G2n−4 may be applied with the gate voltage that is outputted from the (2n−1)-th stage SR2n−1.

The second input terminal of the stage SR2n−3 (not shown) coupled to the (2n−3)-th gate line G2n−3 may be applied with the gate voltage that is outputted from the 2n-th stage SR2n.

The second input terminal of the stage SR2n−2 (not shown) coupled to the (2n−2)-th gate line G2n−2 may be applied with the gate voltage that is outputted from the (2n+1)-th stage SR2n+1.

However, the dummy stages SR2n−1, SR2n, and SR2n+1 may not be coupled to the gate lines, and even when they are coupled thereto, they may be coupled to dummy pixels (not shown) that do not display the image and thus may not be used to display the image.

Each clock input terminal CK may be applied with a clock signal.

First, for the odd-numbered stages, a first clock signal CKV1 and a second clock signal CKVB1 may be alternatingly applied to the clock input terminals CK of the odd-numbered stages (e.g., SR1, SR3, SR5 . . . ).

In an exemplary embodiment, the clock input terminals CK of a first group of the odd-numbered stages (e.g., SR1, SR5, SR9 . . . ) may receive the first clock signal CKV1, and the clock input terminals CK of a second group of the odd-numbered stage (e.g., SR3, SR7, and SR11 . . . ) may receive the second clock signal CKVB1, for example.

For the even-numbered stages, a third clock signal CKV2 and a fourth clock signal CKVB2 may be alternatingly applied to the clock input terminals CK of the even-numbered stages (e.g., SR2, SR4, SR6 . . . ).

In an exemplary embodiment, the clock input terminals CK of a first group of the even-numbered stage (e.g., SR2, SR6, SR10 . . . ) may receive the third clock signal CKV2, and the clock input terminals CK of a second group of the even-numbered stages (e.g., SR4, SR8, SR12 . . . ) may receive the fourth clock signal CKVB2, for example.

In an exemplary embodiment, the first and second clock signals CKV1 and CKVB1 may be opposite in phase to each other.

In an exemplary embodiment, the third and fourth clock signals CKV2 and CKVB2 are may be opposite in phase to each other.

In an exemplary embodiment, the first and third clock signals CKV1 and CKV2 have a phase difference of a quarter cycle, and the third and second clock signals CKV2 and CKVB1 have a phase difference of a quarter cycle, for example.

Turn-on timings of the first to fourth clock signals CKV1 to CKVB2 are as follows. The first clock signal CKV1 is turned on and the third clock signal CKV2 is then turned on, the third clock signal CKV2 is turned on and the second clock signal CKVB1 is then turned on, and the second clock signal CKVB1 is turned on and the fourth clock signal CKVB2 is then turned on.

The low voltage VSS is applied to the voltage input terminal Vin.

The low voltage VSS may be variously changed depending on the exemplary embodiments.

In an exemplary embodiment, the low voltage VSS may be about −10 volts (V), for example.

Next, operations of the first and second gate driver 500 and 550 are described as follows.

First, when the clock input terminal CK of the first stage SR1 receives the first clock signal CKV1 from the outside and the first input terminal IN1 receives the first scan start signal STVP1, the first stage SR1 outputs the gate voltage through the gate voltage output terminal OUT to the gate line G1 that is coupled to the first stage SR1.

In this case, the transfer signal CR is outputted to the first input terminal IN1 of the next odd-numbered stage SR3 through the transfer signal output terminal CRout of the first stage SR1.

The low voltage VSS is supplied to the voltage input terminal Vin of the first stage SR1, and the second input terminal IN2 thereof receives the gate voltage that is generated from the fourth stage SR4.

Then, when the clock input terminal CK of the second stage SR2 receives the third clock signal CKV2 from the outside and the first input terminal IN1 receives the second scan start signal STVP2, the second stage SR2 outputs the gate voltage through the gate voltage output terminal OUT to the gate line G2 that is coupled to the second stage SR2.

In this case, the transfer signal CR is outputted to the first input terminal IN1 of the next even-numbered stage SR4 through the transfer signal output terminal CRout of the second stage SR2.

The low voltage VSS is supplied to the voltage input terminal Vin of the second stage SR2, and the second input terminal IN2 thereof receives the gate voltage that is generated from the fifth stage SR5.

When the clock input terminal CK of the third stage SR3 receives the second clock signal CKVB1 from the outside and the first input terminal IN1 receives the transfer signal CR of the first stage SR1, the third stage SR3 outputs the gate voltage through the gate voltage output terminal OUT to the gate line G3 that is coupled to the third stage SR3.

In this case, the transfer signal CR is outputted to the first input terminal IN1 of the next odd-numbered stage SR5 through the transfer signal output terminal CRout of the third stage SR3.

The low voltage VSS is supplied to the voltage input terminal Vin of the third stage SR3, and the second input terminal IN2 thereof receives the gate voltage that is generated from the sixth stage SR6.

Then, when the clock input terminal CK of the fourth stage SR4 receives the fourth clock signal CKVB2 from the outside and the first input terminal IN1 receives the transfer signal CR of the second stage SR2, the fourth stage SR4 outputs the gate voltage through the gate voltage output terminal OUT to the gate line G4 that is coupled to the fourth stage SR4.

In this case, the transfer signal CR is outputted to the first input terminal IN1 of the next even-numbered stage SR6 through the transfer signal output terminal CRout of the fourth stage SR4.

Then, the gate voltage outputted to the gate line G4 that is coupled to the fourth stage SR4 is transferred to the second input terminal IN2 of the first stage SR1.

The low voltage VSS is supplied to the voltage input terminal Vin of the fourth stage SR4, and the second input terminal IN2 thereof receives the gate voltage that is generated from the seventh stage (not shown).

When the clock input terminal CK of the fifth stage SR5 receives the first clock signal CKV1 from the outside and the first input terminal IN1 receives the transfer signal CR of the third stage SR3, the fifth stage SR5 outputs the gate voltage through the gate voltage output terminal OUT to the gate line G5 that is coupled to the fifth stage SR5.

In this case, the transfer signal CR is outputted to the first input terminal IN1 of the next odd-numbered stage (not shown) through the transfer signal output terminal CRout of the fifth stage SR5.

The gate voltage outputted to the gate line G5 that is coupled to the fifth stage SR5 is transferred to the second input terminal IN2 of the second stage SR2.

The low voltage VSS is supplied to the voltage input terminal Vin of the fifth stage SR5, and the second input terminal IN2 thereof receives the gate voltage that is generated from the eighth stage (not shown).

When the clock input terminal CK of the sixth stage SR6 receives the third clock signal CKV2 from the outside and the first input terminal IN1 receives the transfer signal CR of the fourth stage SR4, the sixth stage SR6 outputs the gate voltage through the gate voltage output terminal OUT to the gate line G6 that is coupled to the sixth stage SR6.

In this case, the transfer signal CR is outputted to the first input terminal IN1 of the next even-numbered stage (not shown) through the transfer signal output terminal CRout of the sixth stage SR6.

Then, the gate voltage outputted to the gate line G6 that is coupled to the sixth stage SR6 is transferred to the second input terminal IN2 of the third stage SR3.

The low voltage VSS is supplied to the voltage input terminal Vin of the sixth stage SR6, and the second input terminal IN2 thereof receives the gate voltage that is generated from the ninth stage (not shown).

According to the exemplary embodiment of the method described above, when the clock input terminal CK of the (2k−1)-th stage receives the first clock signal CKV1 from the outside and the first input terminal IN1 receives the transfer signal CR of the (2k−3)-th stage, the (2k−1)-th stage outputs the gate voltage through the gate voltage output terminal OUT to the gate line that is coupled to the (2k−1)-th stage. In this case, the transfer signal CR is outputted to the first input terminal IN1 of the (2k+1)-th stage through the transfer signal output terminal CRout of the (2k−1)-th stage.

The gate voltage outputted to the gate line that is coupled to the (2k−1)-th stage is transferred to the second input terminal IN2 of the (2k−4)-th stage. The low voltage VSS is supplied to the voltage input terminal Vin of the (2k−1)-th stage, and the second input terminal IN2 thereof receives the gate voltage that is generated from the (2k+2)-th stage.

When the clock input terminal CK of the 2k-th stage receives the third clock signal CKV2 or the fourth clock signal CKVB2 from the outside and the first input terminal IN1 receives the transfer signal CR of the (2k−2)-th stage, the 2k-th stage outputs the gate voltage through the gate voltage output terminal OUT to the gate line that is coupled to the 2k-th stage.

In this case, the transfer signal CR is outputted to the first input terminal IN1 of the (2k+2)-th stage through the transfer signal output terminal CRout of the 2k-th stage.

The gate voltage outputted to the gate line that is coupled to the 2k-th stage is transferred to the second input terminal IN2 of the (2k−3)-th stage.

The low voltage VSS is supplied to the voltage input terminal Vin of the 2k-th stage, and the second input terminal IN2 thereof receives the gate voltage that is generated from the (2k+3)-th stage.

Referring to FIG. 2, a connection structure of the stages SR of the first and second gate drivers 500 and 550 has been described.

A structure of the stage SR of the gate driver coupled to one gate line will now be described in detail with reference to FIG. 3.

Figure 3:
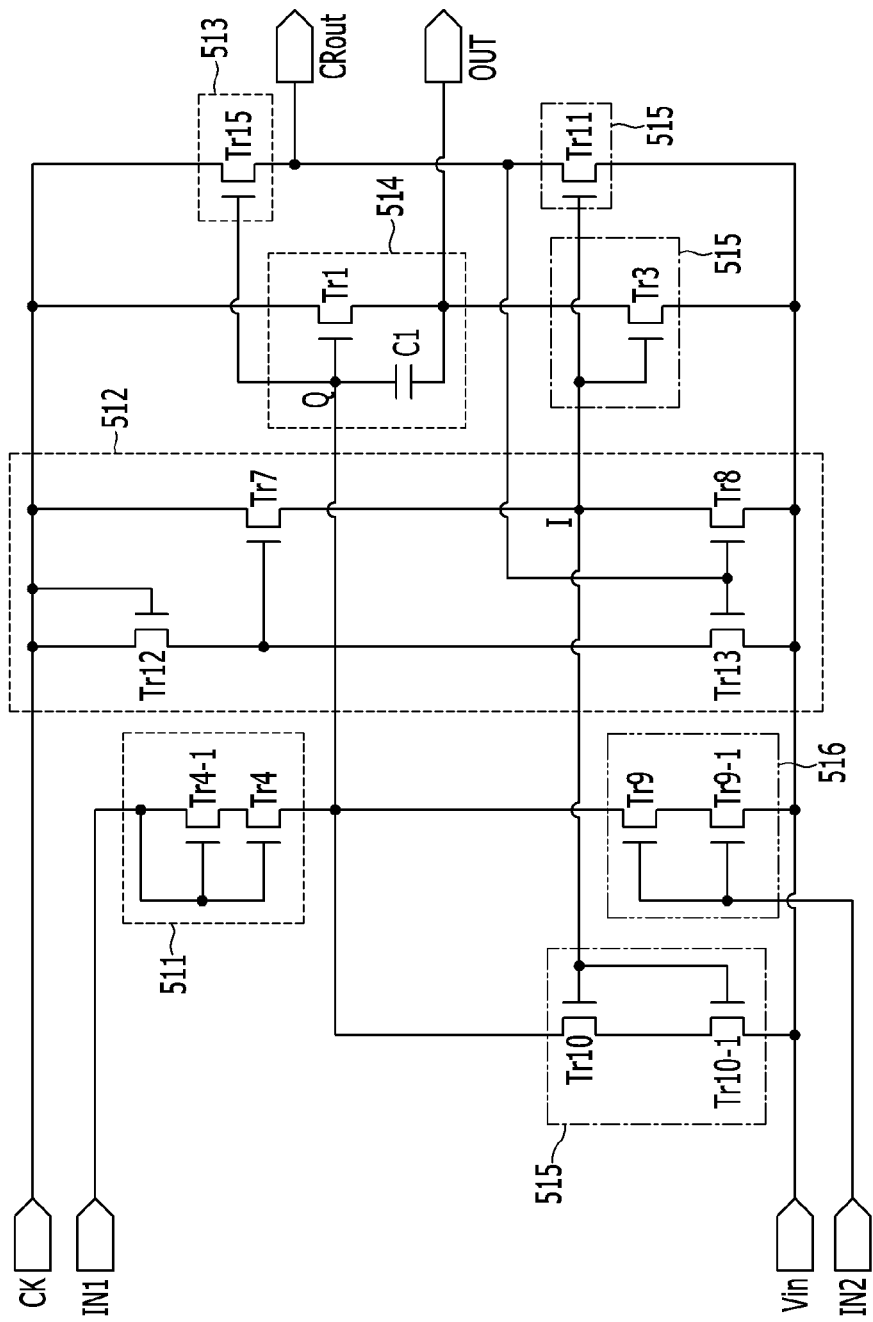
FIG. 3 is a partial enlarged circuit diagram of an exemplary embodiment of one stage of a gate driver according to the exemplary embodiment of FIG. 2.

FIG. 3 is a partial enlarged circuit diagram of one stage of the first and second gate drivers 500 and 550 according to the exemplary embodiment.

A stage to be described below is assumed to be the k-th stage.

Each stage SR of the first and second gate drivers 500 and 550 includes an input unit 511, an inverter unit 512, a transfer signal generator 513, an output unit 514, a noise remover 515, and a pull-down unit 516.

A transistor to be described below is assumed to be an n-channel transistor, for example.

In this case, a first electrode of the transistor is assumed to be a drain of the n-channel transistor, a second electrode thereof is assumed to be a source of the n-channel transistor, and a gate electrode thereof is assumed to be a gate of the n-channel transistor.

First, the input unit 511 includes at least one transistor (e.g., a fourth transistor Tr4 and/or a (4-1)th transistor Tr4-1).

In the illustrated exemplary embodiment, a first electrode and a gate electrode of the fourth transistor Tr4 are both coupled (diode-connected) to a first input terminal IN1, and a second electrode is coupled to a Q node (hereinafter also referred to as a first node).

When a high voltage is applied to the first input terminal IN1, the input unit 511 serves to transfer the high voltage to the Q node.

The inverter unit 512 includes four transistors (a twelfth transistor Tr12, a seventh transistor Tr7, an eighth transistor Tr8, and a thirteenth transistor Tr13).

First, a first electrode and a gate electrode of the twelfth transistor Tr12 are both coupled (diode-connected) to a clock input terminal CK, and the second electrode of the twelfth transistor Tr12 is coupled to a gate electrode of the seventh transistor Tr7 and a first electrode of the thirteenth transistor Tr13.

The gate electrode of the seventh transistor Tr7 is coupled to second electrode of the twelfth transistor Tr12, a first electrode of the seventh transistor Tr7 is coupled to the clock input terminal CK, and a second electrode of the seventh transistor Tr7 is coupled to an I node (also referred to as an inverter node or second node).

A gate electrode of the eighth transistor Tr8 is coupled to a transfer signal output terminal CRout of the current stage, a first electrode of the eighth transistor Tr8 is coupled to the I node, and a second electrode of the eighth transistor Tr8 is coupled to a voltage input terminal Vin.

The first electrode of the thirteenth transistor Tr13 is coupled to the second electrode of the twelfth transistor Tr12, a gate electrode of the thirteenth transistor Tr13 is coupled to the transfer signal output terminal CRout of the current stage, and a second electrode of the thirteenth transistor Tr13 is coupled to the voltage input terminal Vin.

According to a connection as described above, when a high-level clock signal is applied to the clock input terminal CK, a high-level signal is outputted to the second electrode of the diode-connected twelfth transistor Tr12.

Then, as the high-level signal is input to the gate electrode of the seventh transistor Tr7 to output the high-level signal to the second electrode of the seventh transistor Tr7, a voltage level of the I node is thereby converted to a high level.

The transfer signal CR outputted from the transfer signal output terminal CRout of the current stage is applied to the gate electrodes of the thirteenth transistor Tr13 and the eighth transistor Tr8.

Then, the voltage of the I node coupled to the eighth transistor Tr8 is converted to the low voltage VSS, and the low voltage VSS is applied to the gate electrode of the seventh transistor Tr7.

As a result, the I node of the inverter unit 512 has a voltage level that is of opposite polarity with respect to the transfer signal CR and the gate voltage that are outputted from the current stage.

The transfer signal generator 513 includes one transistor (a fifteenth transistor Tr15).

A first electrode of the fifteenth transistor Tr15 is coupled to the clock input terminal CK, a gate electrode is coupled to an output of the input unit 511, that is, the Q node, and a second electrode is coupled to the transfer signal output terminal CRout that outputs the transfer signal CR.

In this case, a parasitic capacitor (not shown) may be provided between the control and output terminals thereof.

The second electrode of the fifteenth transistor Tr15 is coupled to the transfer signal output terminal CRout and a first electrode of the eleventh transistor Tr11.

The output unit 514 includes a first transistor Tr1 and a capacitor C1.

A gate electrode of the first transistor Tr1 is coupled to the Q node, a first electrode is coupled to the clock input terminal CK, and a second electrode is coupled to the gate voltage output terminal OUT and the pull-down unit 516.

A first electrode of the first capacitor C1 is coupled to the gate electrode of the first transistor Tr1, and a second electrode of the first capacitor C1 is coupled to the second electrode of the first transistor Tr1.

The output unit 514 outputs the gate voltage to the gate voltage output terminal OUT depending on the voltage at the Q node and the signal applied to the clock input terminal CK.

In an exemplary embodiment, a voltage difference is generated between the gate electrode and the second electrode of the first transistor Tr1 by the voltage that is applied to the Q node, for example.

When the voltage difference is stored in the capacitor C1 and the high-level clock signal is then applied to the first electrode of the first transistor Tr1, the charged voltage in the capacitor C1 is boosted up due to the coupling, and the gate voltage is outputted to the gate voltage output terminal OUT.

The noise remover 515 includes a third transistor Tr3, tenth and (10-1)-th transistors Tr10 and Tr10-1, and an eleventh transistor Tr11, and gate electrodes of the transistors Tr3, Tr10, Tr10-1, and Tr11 are respectively coupled to the I node.

A first electrode of the third transistor Tr3 is coupled to the second electrode of the first transistor Tr1, and a second electrode of the third transistor Tr3 is coupled to the voltage input terminal Vin.

The third transistor Tr3 transfers the low voltage VSS to second electrode of the first transistor Tr1 according to the voltage of the I node, thereby converting the voltage of the gate voltage output terminal OUT to a low level.

The second electrode of the tenth transistor Tr10 is coupled to a first electrode of the (10-1)-th transistor Tr10-1, and gate electrodes of the tenth transistor Tr10 and the (10-1)-th transistor Tr10-1 are both coupled to the I node.

A first electrode of the tenth transistor Tr10 is coupled to the Q node, and the second electrode of the (10-1)-th transistor Tr10-1 is coupled to the voltage input terminal Vin.

The tenth and (10-1)-th transistors Tr10 and Tr10-1 transfer the low voltage VSS to the Q node according to voltage of the I node.

Depending on exemplary embodiments, the tenth and the (10-1)-th transistors Tr10 and Tr10-1 may be provided to have a structure in which three or more TFTs are connected.

The first electrode of the eleventh transistor Tr11 is coupled to second electrode of the fifteenth transistor Tr15, and a second electrode of the eleventh transistor Tr11 is coupled to the voltage input terminal Vin.

The eleventh transistor Tr11 transfers the low voltage VSS to second electrode of the fifteenth transistor Tr15 according to the voltage of the I node, thereby converting a voltage level of the voltage transfer signal output terminal CRout to the low level. The pull-down unit 516 is controlled by the gate voltage that is outputted from the (k+3)-th stage, and includes a ninth transistor Tr9 and a (9-1)-th transistor Tr9-1.

The second electrode of the ninth transistor Tr9 is coupled to a first electrode of the (9-1)-th transistor Tr9-1, and gate electrodes of the ninth transistor Tr9 and the (9-1)-th transistor Tr9-1 are both coupled to a second input terminal IN2.

A first electrode of the ninth transistor Tr9 is coupled to the Q node, and the second electrode of the (9-1)-th transistor Tr9-1 is coupled to the voltage input terminal Vin.

The ninth transistor Tr9 and the (9-1)-th transistor Tr9-1 transfer the low voltage VSS to the Q node according to the voltage of the second input terminal IN2. Depending on exemplary embodiments, the ninth and (9-1)-th transistors Tr9 and Tr9-1 may be provided to have a structure in which three or more TFTs are additionally connected.

That is, when the voltage of the Q node is at the high level, the transfer signal generator 513 and output unit 514 operate to output the high-level transfer signal CR and the high-level gate voltage at the k-th stage.

Further, at the k-th stage, the voltage of the Q node is converted to the low level by the high-level gate voltage that is outputted from the (k+3)-th stage and the low voltage VSS, and the noise remover 515 and the pull-down unit 516 operate to convert the transfer signal CR and the gate voltage to the low level when the voltage of the inverter node I is converted to the high level according to a level of the clock signal.

Next, an operation of the gate drivers will be described with reference to FIGS. 4 and 5.

Figure 4:
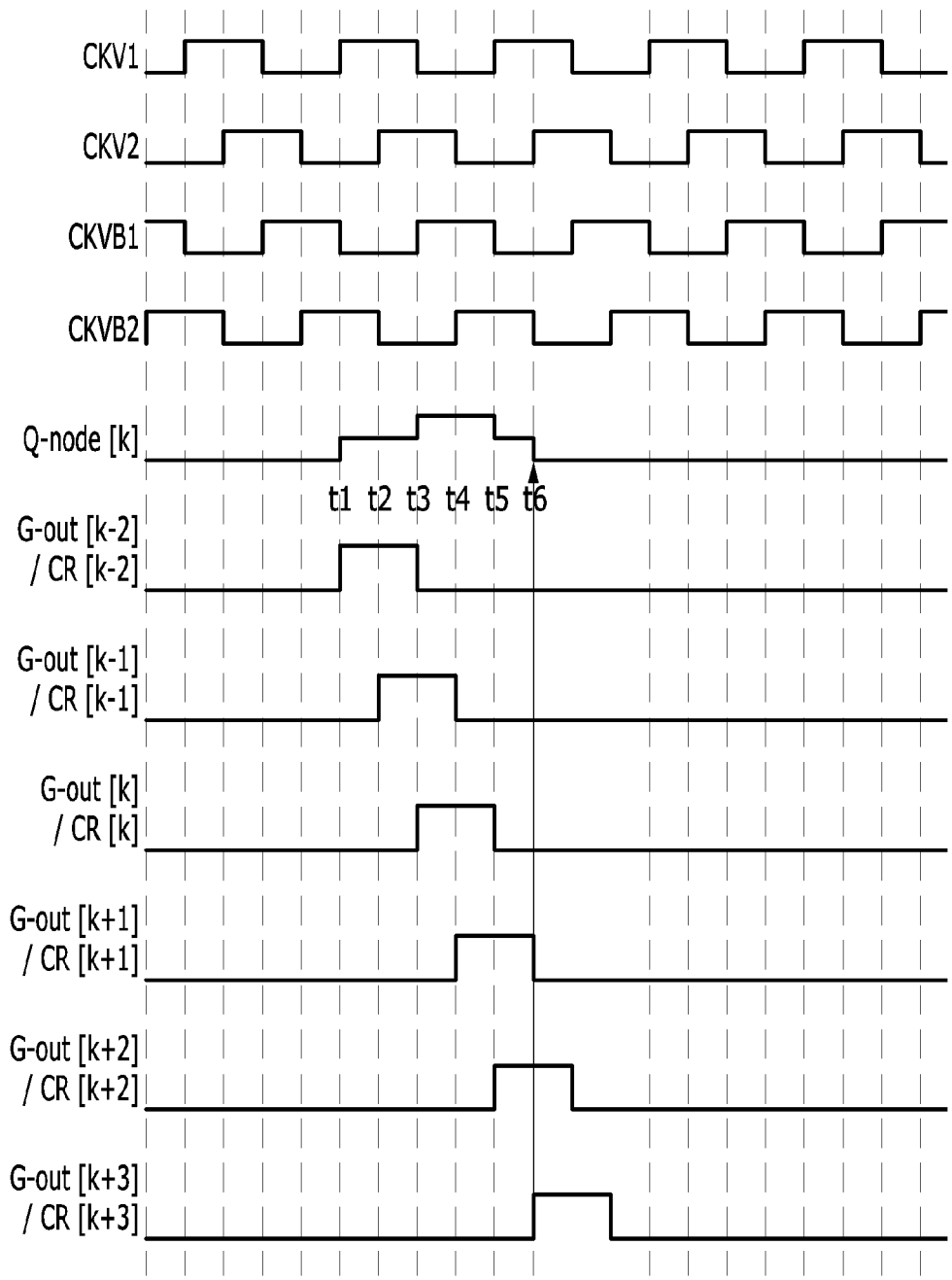
FIG. 4 is a timing diagram of operation characteristics of the gate driver according to an exemplary embodiment.

FIG. 4 is a timing diagram of operation characteristics of the gate driver according to an exemplary embodiment.

A horizontal axis represents time, and a vertical axis represents first to fourth clock signals CKV1 to CKVB2, the voltage of the Q node of the k-th stage, and the gate voltages outputted to the gate voltage output terminals OUT of the (k−2)-th to (k+3)-th stages.

The (k−2)-th stage, the k-th stage, and the (k+2)-th stage are included in the first gate driver 500, and the (k−1)-th stage, the (k+1)-th stage, and the (k+3)-th stage are included in the second gate driver 550.

In addition, the gate voltage and the transfer signal CR of the same stage may be outputted with the same timing.

First, at a time t1, the gate voltage G-out[k−2] of the (k−2)-th stage is outputted while being synchronized with the first clock signal CKV1.

In this case, the voltage of the Q node of the k-th stage increases by the signal that is received by the first input terminal IN1 of the k-th stage.

The signal inputted to the first input terminal IN1 of the k-th stage, which is the signal to be converted to the high level at the time t1, may be the transfer signal CR[k−2] of the (k−2)-th stage. The capacitor C1 is floated by the converted voltage of the Q node in a pre-charged state.

At a time t2, the gate voltage G-out[k−1] of the (k−1)-th stage is outputted while being synchronized with the third clock signal CKV2.

At a time t3, the gate voltage G-out[k] of the k-th stage is outputted while being synchronized with the second clock signal CKVB1.

When the high-level second clock signal CKVB1 received by the clock input terminal CK is applied to the first electrode of the first transistor Tr1, the high-level signal is outputted to the gate voltage output terminal OUT.

In this case, the voltage of the gate electrode of the first transistor Tr1 coupled to the Q node increases according to a bootstrap operation of the capacitor C1.

At a time t4, the gate voltage G-out[k+1] of the (k+1)-th stage is outputted while being synchronized with the fourth clock signal CKVB2.

At a time t5, the gate voltage G-out[k+2] of the (k+2)-th stage is outputted while being synchronized with the first clock signal CKV1.

At a time t6, the gate voltage G-out[k+3] of the (k+3)-th stage is outputted while being synchronized with the third clock signal CKV2.

The gate voltage outputted from the (k+3)-th stage is transferred to the second input terminal IN2 of the k-th stage.

When the gate voltage transferred to the second input terminal IN2 is applied to the pull-down unit 516 of the k-th stage, the voltage of the Q node of the k-th stage is converted to the low voltage VSS.

In the above description, the gate voltage G-out[k+3] outputted from the (k+3)-th stage at the time t6 has been described such that it is transferred to the second input terminal IN2 of the k-th stage, but the signal that is to be converted to the high level at the time t6 or the transfer signal CR[k+3] outputted from the (k+3)-th stage may be applied to the second input terminal IN2 of the k-th stage.

In this case, the transfer signal output terminal CRout of the (k+3)-th stage and the second input terminal IN2 of the k-th stage may be coupled through an additional wire such that the second input terminal IN2 of the k-th stage receives the transfer signal CR[k+3] outputted from the (k+3)-th stage.

The input and output signals of the k-th stage will now be described in detail with reference to FIG. 5.

Figure 5:
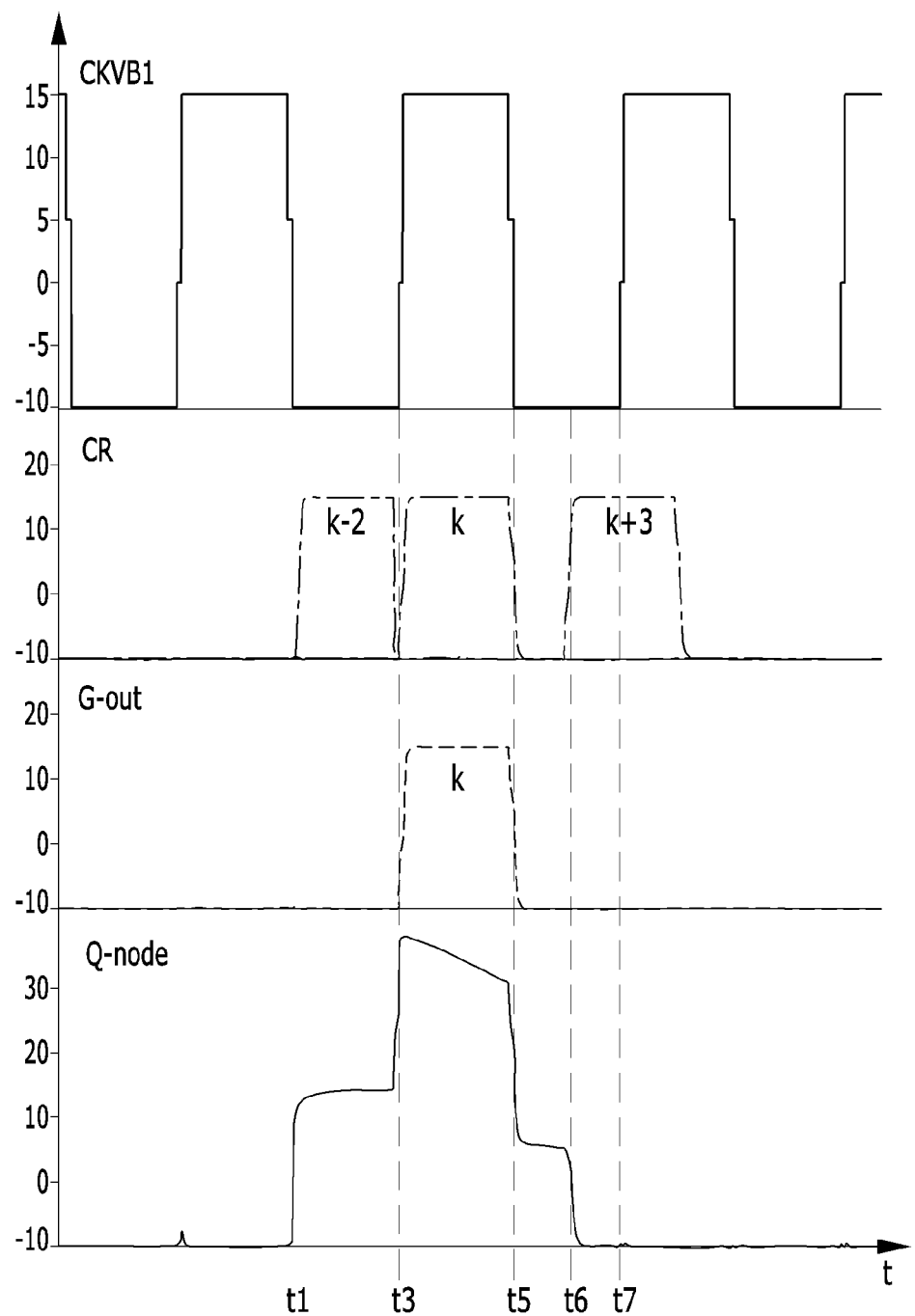
FIG. 5 is a timing diagram of the exemplary embodiment of an operation characteristic of a k-th stage included in the gate driver according to the invention.

FIG. 5 is a timing diagram of an operation characteristic of a k-th stage included in the gate driver according to the exemplary embodiment.

A horizontal axis represents time, a vertical axis represents a second clock signal CKVB1 received by the k-th stage, the voltage of the Q node, and the signal received by the first and second input terminals IN1 and IN2 of the k-th stage.

At a time t1, the transfer signal CR of the (k−2)-th stage is converted to the high level.

Then, the transfer signal CR of the (k−2)-th stage is transferred to the first input terminal IN1 of the k-th stage, and the voltage of the Q node increases by the operation of the input unit 511.

At a time t3, when the high-level second clock signal CKVB1 is applied to the clock input terminal CK of the k-th stage, the transfer signal generator 513 of the k-th stage outputs the transfer signal CR.

In this case, the gate voltage is outputted to the output unit 514, that is, second electrode of the first transistor Tr1, such that the voltage of the Q node increases further than the voltage of the Q node at the time t1.

At a time t5, as the second clock signal CKVB1 decreases to the low level, the voltage of the Q node decreases.

Even when the voltage of the Q node decreases, the voltage of the gate voltage output terminal OUT is converted to the low level of the second clock signal CKVB1, since a predetermined level of voltage is received by the gate electrode of the first transistor Tr1.

In other words, at the time t5, since the voltage of the Q node decreases to the voltage level that allows the first transistor Tr1 to operate, the second clock signal CKVB1 converted to the low level is applied to the first electrode of the first transistor Tr1.

Thus, the voltage of the second electrode of the first transistor Tr1, that is, the voltage of the gate voltage output terminal OUT, may be converted to the second clock signal CKVB1 at the low level.

Next, at a time t6, the gate voltage of the (k+3)-th stage is transferred to the second input terminal IN2 of the k-th stage.

As the high-level gate voltage is transferred, the pull-down unit 516 operates to convert the voltage of the Q node to the low voltage VSS.

After a time t7, when the second clock signal CKVB1 is converted to the high level, the voltage of the I node is also converted to the high level, and the gate voltage output terminal OUT, the transfer signal output terminal CRout, and the voltage of the Q node are maintained at the low voltage VSS by the operation of the noise remover 515.

Figure 6:
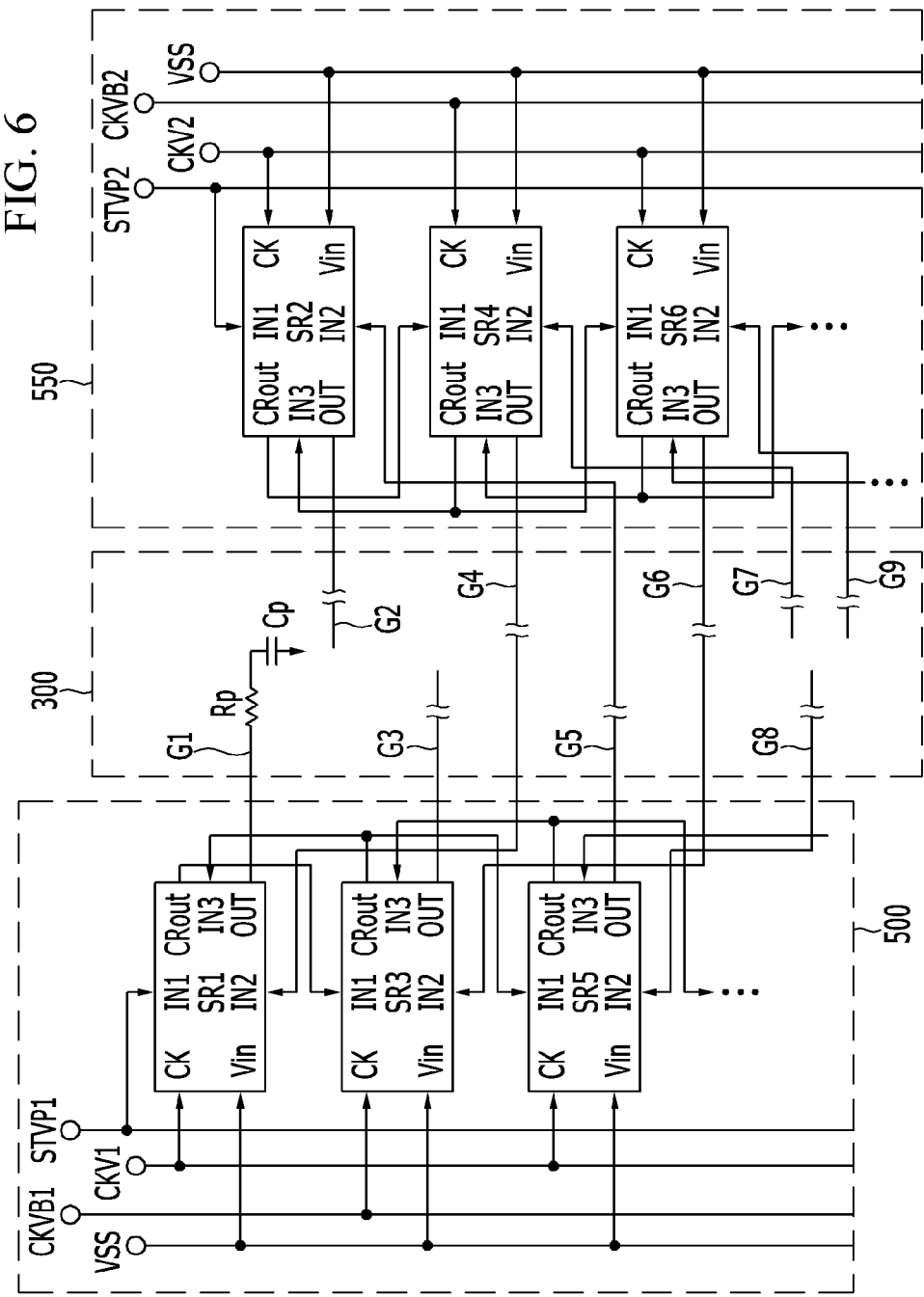
FIG. 6 is a block diagram specifically illustrating another exemplary embodiment of the first gate driver, the second gate driver, and the gate lines according to the exemplary embodiment of FIG. 1

FIG. 6 is a block diagram specifically illustrating another exemplary embodiment of the first gate driver, the second gate driver, and the gate lines according to the exemplary embodiment of FIG. 1

Operation characteristics of the first and second gate drivers 500 and 550 of FIG. 6 are similar to those of the first and second gate drivers 500 and 550 that have been described in FIGS. 4 and 5.

In the exemplary embodiment of FIG. 6, a third input terminal IN3 is added to each stage.

The third input terminals IN3 of the odd-numbered stages SR1, SR3, SR5 . . . are coupled to the transfer signal output terminals CRout of the next odd-numbered stage such that they receive the transfer signals CR of the next odd-numbered stages.

The third input terminals IN3 of the even-numbered stages SR2, SR4, SR6 . . . are coupled to the transfer signal output terminals CRout of the next even-numbered stages such that they receive the transfer signals CR of the next even-numbered stages.

A structure of a stage SR of a gate driver coupled to one gate line will now be described in more detail with reference to FIG. 7.

Figure 7:
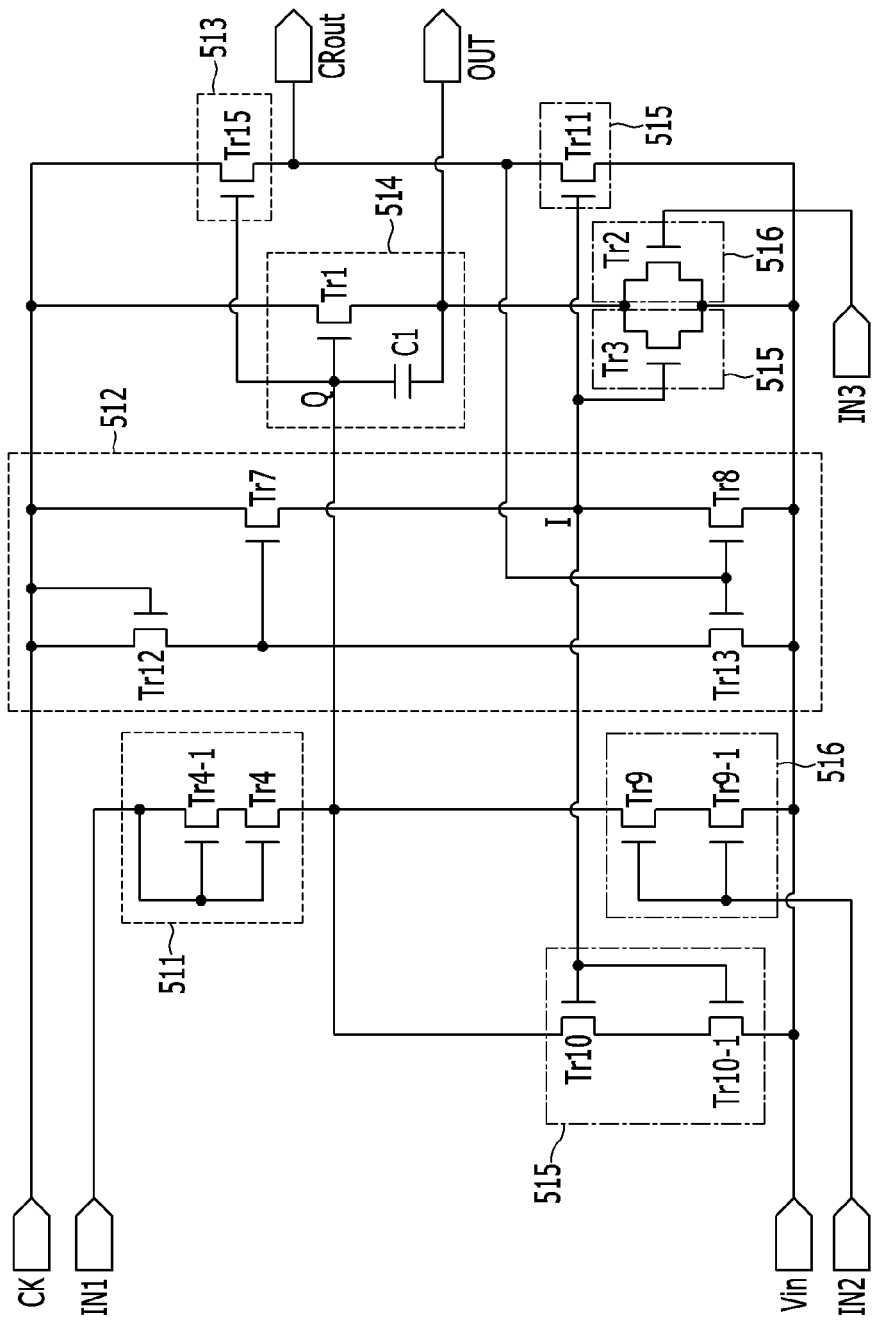
FIG. 7 is a partial enlarged circuit diagram of one stage of the gate driver according to the exemplary embodiment of FIG. 6.

FIG. 7 is a partial enlarged circuit diagram of one stage of the gate driver according to the exemplary embodiment of FIG. 6.

When compared with the exemplary embodiment of FIG. 3, the exemplary embodiment of FIG. 7 further includes a second transistor Tr2.

A gate electrode of the second transistor Tr2 is coupled to the third input terminal IN3.

A first electrode of the second transistor Tr2 is coupled to the gate voltage output terminal OUT, and a second electrode is coupled to the voltage input terminal Vin.

When the current stage is the k-th stage, the gate electrode of the second transistor Tr2 receives the transfer signal CR that is outputted from the (k+2)-th stage through the third input terminal IN3.

Then, the voltage of the gate voltage output terminal OUT coupled to the first electrode of the second transistor Tr2 is converted to the low voltage VSS through the voltage input terminal Vin that is coupled to second electrode of the transistor Tr2.

In the above description, the display device using one low voltage VSS has been described.

A display device 100 using two low voltages VSS1 and VSS2 will now be described with reference to FIGS. 8 to 11.

Figure 8:
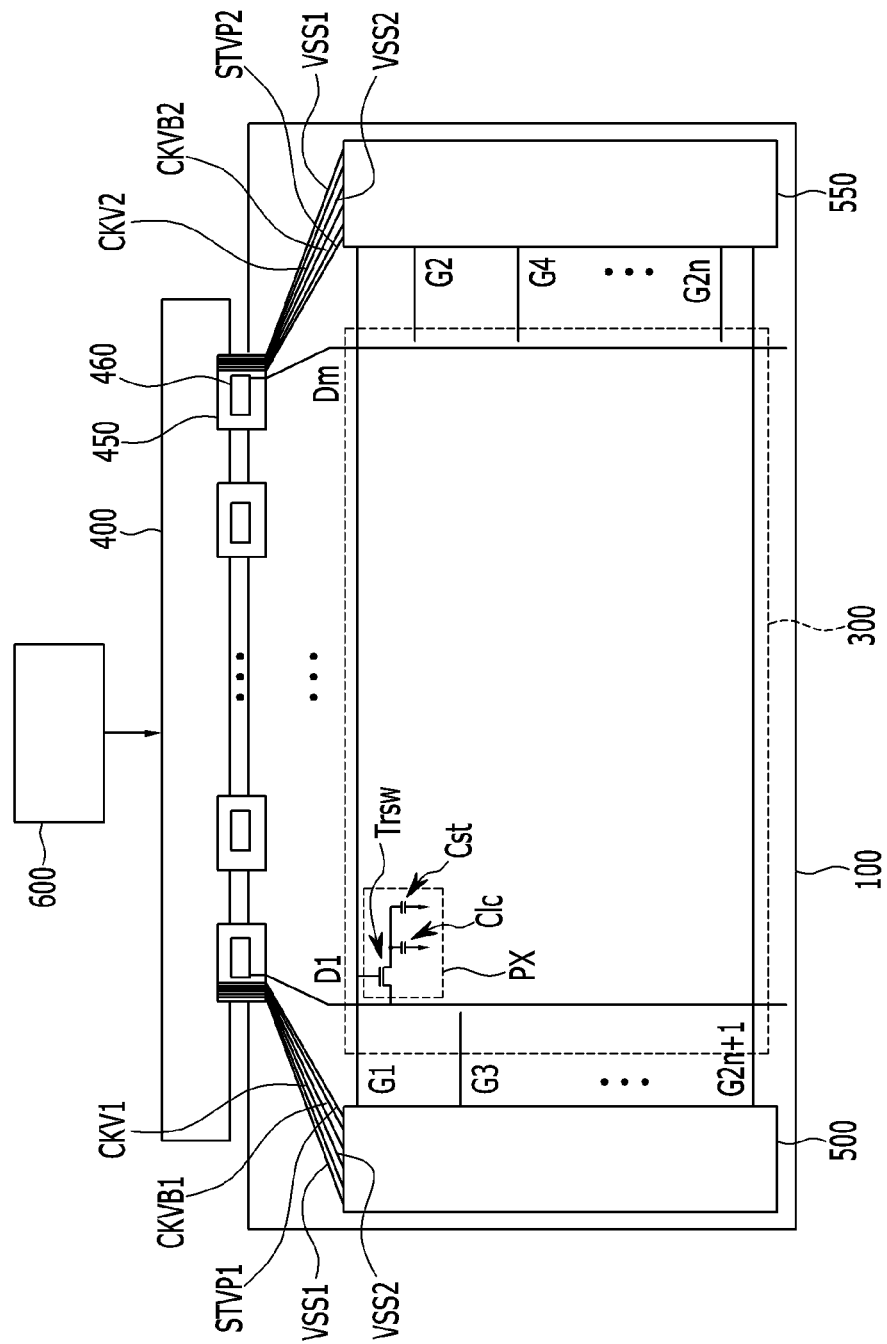
FIG. 8 is a top plan view of another exemplary embodiment of a display device according to the invention.

FIG. 8 is a top plan view of a display device according to another exemplary embodiment.

When compared with the exemplary embodiment of FIG. 1, in the exemplary embodiment of FIG. 8, first and second low voltages VSS1 and VSS2 from the signal controller 600 are supplied to the first and second gate drivers 500 and 550.

Referring to FIG. 8, a display device 100 according to an exemplary embodiment includes a display area 300 for displaying an image, and first and second gate drivers 500 and 550 for supplying the gate voltage to the gate lines G1 to G2n+1 of the display area 300.

In an exemplary embodiment, a data driver IC 460 for supplying data voltages to data lines D1 to Dm of the display area 300 may be disposed on a film such as a FPC film 450.

The data driver IC 460, the first gate driver 500, and the second gate driver 550 are controlled by a signal controller 600.

The FPC film 450 is electrically coupled to a PCB 400, and signals from the signal controller 600 are transferred to the data driver IC 460, the first gate driver 500, and the second gate driver 550 through the PCB 400 and the FPC film 450.

The signal controller 600 provides signals including a first clock signal CKV1, a second clock signal CKVB1, a third clock signal CKV2, a fourth clock signal CKVB2, scan start signals STVP1 and STVP2, and a signal for supplying a specific level of low voltages VSS1 and VSS2.

The display area 300 includes a plurality of pixels PX.

When the display device 100 is an LCD, each pixel PX includes a TFT Trsw, a liquid crystal capacitor Clc, and a storage capacitor Cst.

A gate electrode of the TFT Trsw is coupled to one gate line, a first electrode of the TFT Trsw is coupled to one data line, and the second electrode of the TFT Trsw is coupled to a first electrode of the liquid crystal capacitor Clc and a first electrode of the storage capacitor Cst.

A second electrode of the liquid crystal capacitor Clc is coupled to a common electrode, and a second electrode of the storage capacitor Cst is applied with a storage voltage Vcst that is applied from the signal controller 600.

There are various exemplary embodiments for a structure of the pixel PX of the LCD, and the invention may be applicable even to the pixel PX having an additional configuration in addition to a basic structure of the pixel PX illustrated in FIG. 8.

In FIG. 8, a case in which the display device 100 is an LCD is exemplarily described, but the pixel PX includes a TFT and an OLED when the display device 100 is an OLED display, and in other types of display devices, the display area 300 is provided to include a TFT and the like.

The invention is not limited to the LCD, but for clarity of the description, the LCD will be exemplarily described.

The display area 300 includes a plurality of gate lines G1 to G2n+1 and a plurality of data lines D1 to Dm, and the plurality of gate lines G1 to G2n+1 and the plurality of data lines D1 to Dm cross each other while being insulated from each other.

Each pixel PX includes a TFT Trsw, a liquid crystal capacitor Clc, and a storage capacitor Cst.

A gate electrode of the TFT Trsw is coupled to one gate line, a first electrode of the TFT Trsw is coupled to one data line, and the second electrode of the TFT Trsw is coupled to a first electrode of the liquid crystal capacitor Clc and a first electrode of the storage capacitor Cst.

A second electrode of the liquid crystal capacitor Clc is coupled to a common electrode, and a second electrode of the storage capacitor Cst is applied with a storage voltage Vcst that is applied from the signal controller 600.

There are various exemplary embodiments for a structure of the pixel PX of the LCD, and the invention may include a pixel PX having an additional configuration in addition to a basic structure of the pixel PX illustrated in FIG. 8.

The data driver IC 460 is provided at an upper or lower part of the display device 100 and is coupled to the data lines D1 to Dm that extend in a substantially vertical direction, and an exemplary embodiment in which the data driver IC 460 is disposed at the upper part of the display device 100 is illustrated in the exemplary embodiment of the FIG. 8.

In the illustrated exemplary embodiment, the first gate driver 500 and the second gate driver 550 may be respectively provided at right and left sides of the display device 100.

When being applied with the first clock signal CKV1, the second clock signal CKVB1, a first scan start signal STVP1, and the low voltages VSS1 and VSS2, the first gate driver 500 generates a gate voltage (a gate-on voltage or gate-off voltage), and sequentially applies the gate voltage to odd-numbered gate lines G1, G3, . . . , and G2n+1.

That is, the display device 100 according to the exemplary embodiment may have an interlaced structure in which the first gate driver 500 for applying the gate voltage to the odd-numbered gate lines G1, G3, . . . , and G2n+1 is provided at the left side of the display device 100 while the second gate driver 550 for applying the gate voltage to the even-numbered gate lines G2, G4, . . . , and G2n is provided at the right side of the display device 100.

In the above description, an overall structure of the display device 100 according to the exemplary embodiment has been described.

Figure 9:
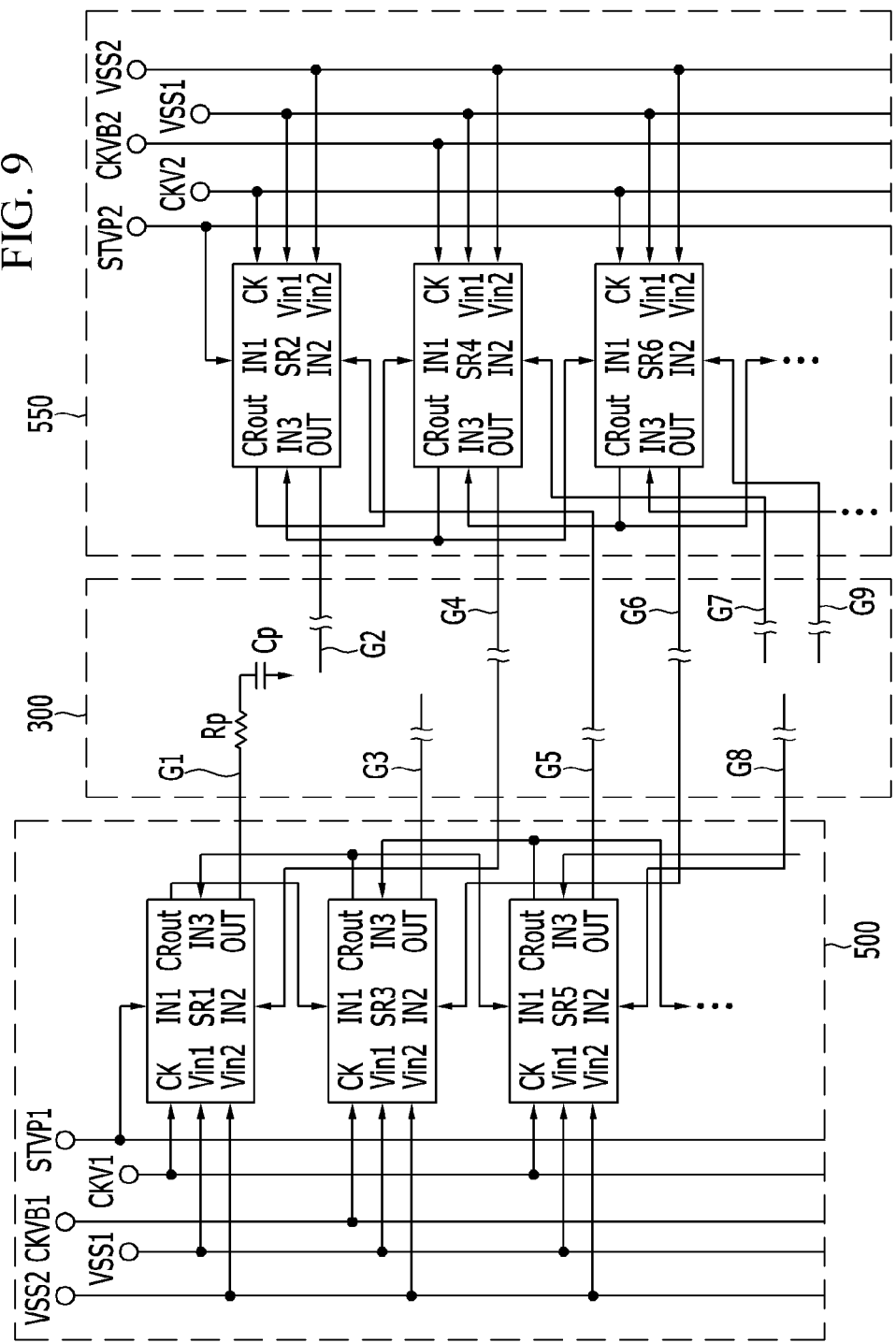
FIG. 9 is a block diagram specifically illustrating one exemplary embodiment of a first gate driver, a second gate driver, and gate lines according to the exemplary embodiment of FIG. 8.

FIG. 9 is a block diagram specifically illustrating one exemplary embodiment of the first gate driver 500, the second gate driver 550, and the gate lines G1 to G2n+1 according to the exemplary embodiment of FIG. 8.

Operation characteristics of the first and second gate drivers 500 and 550 of FIG. 9 are similar to those of the first and second gate drivers 500 and 550 that have been described in FIGS. 4 and 5.

In FIG. 9, the display area 300 is shown as a parasitic resistance Rp and a parasitic capacitance Cp.

Since the gate lines G1 to G2n+1, the liquid crystal capacitor Clc, and the storage capacitor Cst respectively have resistances and capacitances, the resistances and capacitances are all summed to be represented by the resistance Rp and the capacitance Cp.

That is, the gate lines G1 to G2n+1 may be illustrated, as shown in FIG. 9, to have the resistance Rp and the capacitance Cp when equivalently viewed in the circuit.

The resistance Rp and the capacitance Cp are collective values that represent the overall resistance and capacitance of each of the gate lines G1 to G2n+1, and may have different values depending on structures and characteristics of the display area 300.

The gate voltage outputted from the stage SR is transferred to the gate lines G1 to G2n+1.

The first and second gate drivers 500 and 550 will now be described.

The first and second gate drivers 500 and 550 respectively include odd-numbered stages (e.g., SR1, SR3, SR5, . . . ) and an even-numbered stages (e.g., SR2, SR4, SR6, . . . ) that are subordinately coupled to each other.

In the illustrated exemplary embodiment, the first gate driver 500 includes the odd-numbered stages (SR1, SR3, . . . , and SR2n+1) respectively that correspond to the odd-numbered gate lines (e.g., G1, G3, . . . , and G2n+1), and the second gate driver 550 includes the even-numbered stages (e.g., SR2, SR4, . . . and SR2n) that respectively correspond to the even-numbered gate lines G2, G4, . . . , and G2n.

Each of the stages SR1, SR2, SR3, SR4, SR5, SR6 . . . includes three input terminals IN1, IN2, and IN3, one clock input terminal CK, voltage input terminals Vin1 and Vin2, a gate voltage output terminal OUT for outputting the gate voltage, and a transfer signal output terminal CRout.

The first input terminals IN1 of the odd-numbered stages other than of the first odd-numbered state SR1 (e.g., SR3, SR5 . . . ) included in the first gate driver 500 are coupled to the transfer signal output terminals CRout of the previous odd-numbered stages, and are applied with the transfer signals CR of the previous odd-numbered stages. The first input terminal IN1 of the first odd-numbered state SR1 is applied with the first scan start signal STVP1 because the first odd-numbered stage SR1 does not have a previous odd-numbered stage.

The first input terminals IN1 of the even-numbered stages other than a first even-numbered stage SR2 (e.g., SR4, SR6 . . . ) included in the second gate driver 550 are coupled to the transfer signal output terminals CRout of the previous even-numbered stages and are applied with the transfer signal CR of the previous even-numbered stage, and the first input terminal IN1 of the first even-numbered stage SR2 is applied with the second scan start signal STVP2 because the first even-numbered stage SR2 does not have a previous odd-numbered stage.

In this case, timing of the first scan start signal STVP1 applied to the first odd-numbered stage SR1 and timing of the second scan start signal STVP2 applied to the first even-numbered stage SR2 may be continuous, for example.

In an exemplary embodiment, the first scan start signal STVP1 may be turned on earlier than the second scan start signal STVP2 by a quarter cycle of the clock signal, for example.

The second input terminal IN2 of the k-th stage receives the gate voltage that is outputted from the gate voltage output terminal OUT of the (k+3)-th stage.

In an exemplary embodiment, the second input terminals IN2 of the odd-numbered stages SR1, SR3, SR5 . . . are respectively coupled to the gate lines that are coupled to the gate voltage output terminals OUT of the even-numbered stages SR4, SR6, SR8 . . . so as to be applied with the gate voltage, for example.

Similarly, the second input terminals IN2 of the even-numbered stages SR2, SR4, SR6 . . . are respectively coupled to the gate lines that are coupled to the gate voltage output terminals OUT of the odd-numbered stages SR5, SR7, SR9 . . . so as to be applied with the gate voltage.

The stage SR2n−1 (not shown) coupled to the (2n−1)-th gate line G2n−1, the stage SR2n (not shown) coupled to the 2n-th gate line G2n, and the stage SR2n+1 (not shown) coupled to the (2n+1)-th gate line G2n+1 may be provided as dummy stages for applying the gate voltage.

Unlike the other stages SR1 to SRn, the dummy stages SR2n−1, SR2n, and SR2n+1 refer to the stages for generating and then outputting a dummy gate voltage.

Each gate voltage outputted from the stages SR1 to SR2n−2, except for the dummy stages, is transmitted to the pixel through the gate line, thereby displaying an image according to the data voltage.

The second input terminal of the stage SR2n−4 (not shown) coupled to the (2n−4)-th gate line G2n−4 may be applied with the gate voltage that is outputted from the (2n−1)-th stage SR2n−1.

The second input terminal of the stage SR2n−3 (not shown) coupled to the (2n−3)-th gate line G2n−3 may be applied with the gate voltage that is outputted from the 2n-th stage SR2n.

The second input terminal of the stage SR2n−2 (not shown) coupled to the (2n−2)-th gate line G2n−2 may be applied with the gate voltage that is outputted from the (2n+1)-th stage SR2n+1.

However, the dummy stages SR2n−1, SR2n, and SR2n+1 may not be coupled to the gate lines, and even when they are coupled thereto, they may be coupled to dummy pixels (not shown) that do not display the image and thus may not be used to display the image.

The third input terminal IN3 of the k-th stage receives the transfer signal CR that is outputted from the transfer signal output terminal CRout of the (k+2)-th stage. In an exemplary embodiment, the third input terminals IN3 of the odd-numbered stages SR1, SR3, SR5 . . . are applied with the transfer signals CR that are outputted from the transfer signal output terminals CRout of the next odd-numbered stages, for example.

Similarly, the third input terminals IN3 of the even-numbered stages SR2, SR4, SR6 . . . are applied with the transfer signals CR that are outputted from the transfer signal output terminals CRout of the next even-numbered stages.

The clock input terminal CK may be applied with the clock signal.

First, for the odd-numbered stages, a first clock signal CKV1 and a second clock signal CKVB1 may be alternatingly applied to the clock input terminals CK of the odd-numbered stages (e.g., SR1, SR3, SR5 . . . ).

In an exemplary embodiment, the clock input terminals CK of a first group of the odd-numbered stages (e.g., SR1, SR5, SR9 . . . ) may receive the first clock signal CKV1, and the clock input terminals CK of a second group of the odd-numbered stages (e.g., SR3, SR7, and SR11 . . . ) may receive the second clock signal CKVB1, for example.

For the odd-numbered stages, a third clock signal CKV2 and a fourth clock signal CKVB2 may be alternatingly applied to the clock input terminals CK of the even-numbered stages (e.g., SR2, SR4, SR6 . . . ).

In an exemplary embodiment, the clock input terminals CK of a first group of the even-numbered stage (e.g., SR2, SR6, SR10 . . . ) may receive the third clock signal CKV2, and the clock input terminals CK of a second group of the even-numbered stages (e.g., SR4, SR8, SR12 . . . ) may receive the fourth clock signal CKVB2, for example.

In an exemplary embodiment, the first and second clock signals CKV1 and CKVB1 may be opposite in phase to each other.

In an exemplary embodiment, the third and fourth clock signals CKV2 and CKVB2 may be opposite in phase to each other.

In an exemplary embodiment, the first and third clock signals CKV1 and CKV2 have a phase difference of a quarter cycle, and the third and second clock signals CKV2 and CKVB1 have a phase difference of a quarter cycle, for example.

Turn-on timings of the first to fourth clock signals CKV1 to CKVB2 are as follows. The first clock signal CKV1 is turned on and the third clock signal CKV2 is then turned on, the third clock signal CKV2 is turned on and the second clock signal CKVB1 is then turned on, and the second clock signal CKVB1 is turned on and the fourth clock signal CKVB2 is then turned on.

The first low voltage VSS1 is applied to the voltage input terminal Vin1, and the second low voltage VSS2 is applied to the voltage input terminal Vin2.

The first and second low voltages VSS1 and VSS2 may be variously varied according to the exemplary embodiments.

In an exemplary embodiment, the first low voltage VSS1 may be about −5 V, and the second low voltage VSS2 may be about −10 V.

Next, operations of the first and second gate driver 500 and 550 are described as follows.

First, when the clock input terminal CK of the first stage SR1 receives the first clock signal CKV1 from the outside and the first input terminal IN1 receives the first scan start signal STVP1, the first stage SR1 outputs the gate voltage through the gate voltage output terminal OUT to the gate line G1 that is coupled to the first stage SR1.

In this case, the transfer signal CR is outputted to the first input terminal IN1 of the next odd-numbered stage SR3 through the transfer signal output terminal CRout of the first stage SR1.

The first low voltage VSS1 is supplied to the first voltage input terminal Vin1 of the first stage SR1, and the second low voltage VSS2 is supplied to the second voltage input terminal Vin2 of the first stage SR1.

The third input terminal IN3 receives the transfer signal CR that is generated from the third stage SR3, and the second input terminal IN2 receives the gate voltage that is generated from the fourth stage SR4.

Then, when the clock input terminal CK of the second stage SR2 receives the third clock signal CKV2 from the outside and the first input terminal IN1 receives the second scan start signal STVP2, the second stage SR2 outputs the gate voltage through the gate voltage output terminal OUT to the gate line G2 that is coupled to the second stage SR2.

In this case, the transfer signal CR is outputted to the first input terminal IN1 of the next even-numbered stage SR4 through the transfer signal output terminal CRout of the second stage SR2.

The first low voltage VSS1 is supplied to the first voltage input terminal Vin1 of the second stage SR2, and the second low voltage VSS2 is supplied to the second voltage input terminal Vin2 of the second stage SR2.

The third input terminal IN3 receives the transfer signal CR that is generated from the fourth stage SR4, and the second input terminal IN2 receives the gate voltage that is generated from the fifth stage SR5.

When the clock input terminal CK of the third stage SR3 receives the second clock signal CKVB1 from the outside and the first input terminal IN1 receives the transfer signal CR of the first stage SR1, the third stage SR3 outputs the gate voltage through the gate voltage output terminal OUT to the gate line G3 that is coupled to the third stage SR3.

In this case, the transfer signal CR is outputted to the first input terminal IN1 of the next odd-numbered stage SR5 through the transfer signal output terminal CRout of the third stage SR3.

The first low voltage VSS1 is supplied to the first voltage input terminal Vin1 of the third stage SR3, and the second low voltage VSS2 is supplied to the second voltage input terminal Vin2 of the third stage SR3.

The third input terminal IN3 receives the transfer signal CR that is generated from the fifth stage SR5, and the second input terminal IN2 thereof receives the gate voltage that is generated from the sixth stage SR6.

When the clock input terminal CK of the fourth stage SR4 receives the fourth clock signal CKVB2 from the outside and the first input terminal IN1 receives the transfer signal CR of the second stage SR2, the fourth stage SR4 outputs the gate voltage through the gate voltage output terminal OUT to the gate line G4 that is coupled to the fourth stage SR4.

In this case, the transfer signal CR is outputted to the first input terminal IN1 of the next even-numbered stage SR6 through the transfer signal output terminal CRout of the fourth stage SR4.

Then, the gate voltage outputted to the gate line G4 that is coupled to the fourth stage SR4 is transferred to the third input terminal IN3 of the first stage SR1.

The first low voltage VSS1 is supplied to the first voltage input terminal Vin1 of the fourth stage SR4, and the second low voltage VSS2 is supplied to the second voltage input terminal Vin2 thereof.

The third input terminal IN3 receives the transfer signal CR that is generated from the sixth stage SR6, and the second input terminal IN2 receives the gate voltage that is generated from the seventh stage (not shown).

When the clock input terminal CK of the fifth stage SR5 receives the first clock signal CKV1 from the outside and the first input terminal IN1 receives the transfer signal CR of the third stage SR3, the fifth stage SR5 outputs the gate voltage through the gate voltage output terminal OUT to the gate line G5 that is coupled to the fifth stage SR5.

In this case, the transfer signal CR is outputted to the first input terminal IN1 of the next odd-numbered stage (not shown) through the transfer signal output terminal CRout of the fifth stage SR5.

The gate voltage outputted to the gate line G5 that is coupled to the fifth stage SR5 is transferred to the second input terminal IN2 of the second stage SR2.

The first low voltage VSS1 is supplied to the first voltage input terminal Vin1 of the fifth stage SR5, and the second low voltage VSS2 is supplied to the second voltage input terminal Vin2 of the fifth stage SR5.

The third input terminal IN3 of the fifth stage SR5 receives the transfer signal CR that is generated from the seventh stage (not shown), and the second input terminal IN2 receives the gate voltage that is generated from the eighth stage (not shown).

When the clock input terminal CK of the sixth stage SR6 receives the third clock signal CKV2 from the outside and the first input terminal IN1 receives the transfer signal CR of the fourth stage SR4, the sixth stage SR6 outputs the gate voltage through the gate voltage output terminal OUT to the gate line G6 that is coupled to the sixth stage SR6.

In this case, the transfer signal CR is outputted to the first input terminal IN1 of the next even-numbered stage (not shown) through the transfer signal output terminal CRout of the sixth stage SR6.

Then, the gate voltage outputted to the gate line G6 that is coupled to the sixth stage SR6 is transferred to the second input terminal IN2 of the third stage SR3.

The first low voltage VSS1 is supplied to the first voltage input terminal Vin1 of the sixth stage SR6, and the second low voltage VSS2 is supplied to the second voltage input terminal Vin2 thereof.

The third input terminal IN3 receives the transfer signal CR that is generated from the eighth stage (not shown), and the second input terminal IN2 receives the gate voltage that is generated from the ninth stage (not shown).

According to the exemplary embodiment of the method described above, when the clock input terminal CK of the (2k−1)-th stage receives the first clock signal CKV1 from the outside and the first input terminal IN1 receives the transfer signal CR of the (2k−3)-th stage, the (2k−1)-th stage outputs the gate voltage through the gate voltage output terminal OUT to the gate line that is coupled to the (2k−1)-th stage.

In this case, the transfer signal CR is outputted to the first input terminal IN1 of the (2k+1)-th stage through the transfer signal output terminal CRout of the (2k−1)-th stage.

The gate voltage outputted to the gate line that is coupled to the (2k−1)-th stage is transferred to the second input terminal IN2 of the (2k−4)-th stage.

The first low voltage VSS1 is supplied to the first voltage input terminal Vin1 of the (2k−1)-th stage, and the second low voltage VSS2 is supplied to the second voltage input terminal Vin2 of the (2k−1)-th stage.

The third input terminal IN3 of the (2k−1)-th stage receives the transfer signal CR that is generated from the (2k+1)-th stage, and the second input terminal IN2 of the (2k−1)-th stage receives the gate voltage that is generated from the (2k+2)-th stage.

When the clock input terminal CK of the 2k-th stage receives the second clock signal CKVB1 from the outside and the first input terminal IN1 receives the transfer signal CR of the (2k−2)-th stage, the 2k-th stage outputs the gate voltage through the gate voltage output terminal OUT to the gate line that is coupled to the 2k-th stage.

In this case, the transfer signal CR is outputted to the first input terminal IN1 of the (2k+2)-th stage through the transfer signal output terminal CRout of the 2k-th stage.

The gate voltage outputted to the gate line that is coupled to the 2k-th stage is transferred to the second input terminal IN2 of the (2k−3)-th stage.

The first low voltage VSS1 is supplied to the first voltage input terminal Vin1 of the 2k-th stage, and the second low voltage VSS2 is supplied to the second voltage input terminal Vin2 thereof.

The third input terminal IN3 receives the transfer signal CR that is generated from the (2k+2)-th stage, and the second input terminal IN2 receives the gate voltage that is generated from the (2k+3)-th stage.

A structure of a stage SR of a gate driver coupled to one gate line will now be described in detail with reference to FIGS. 9 and 10.

Figure 10:
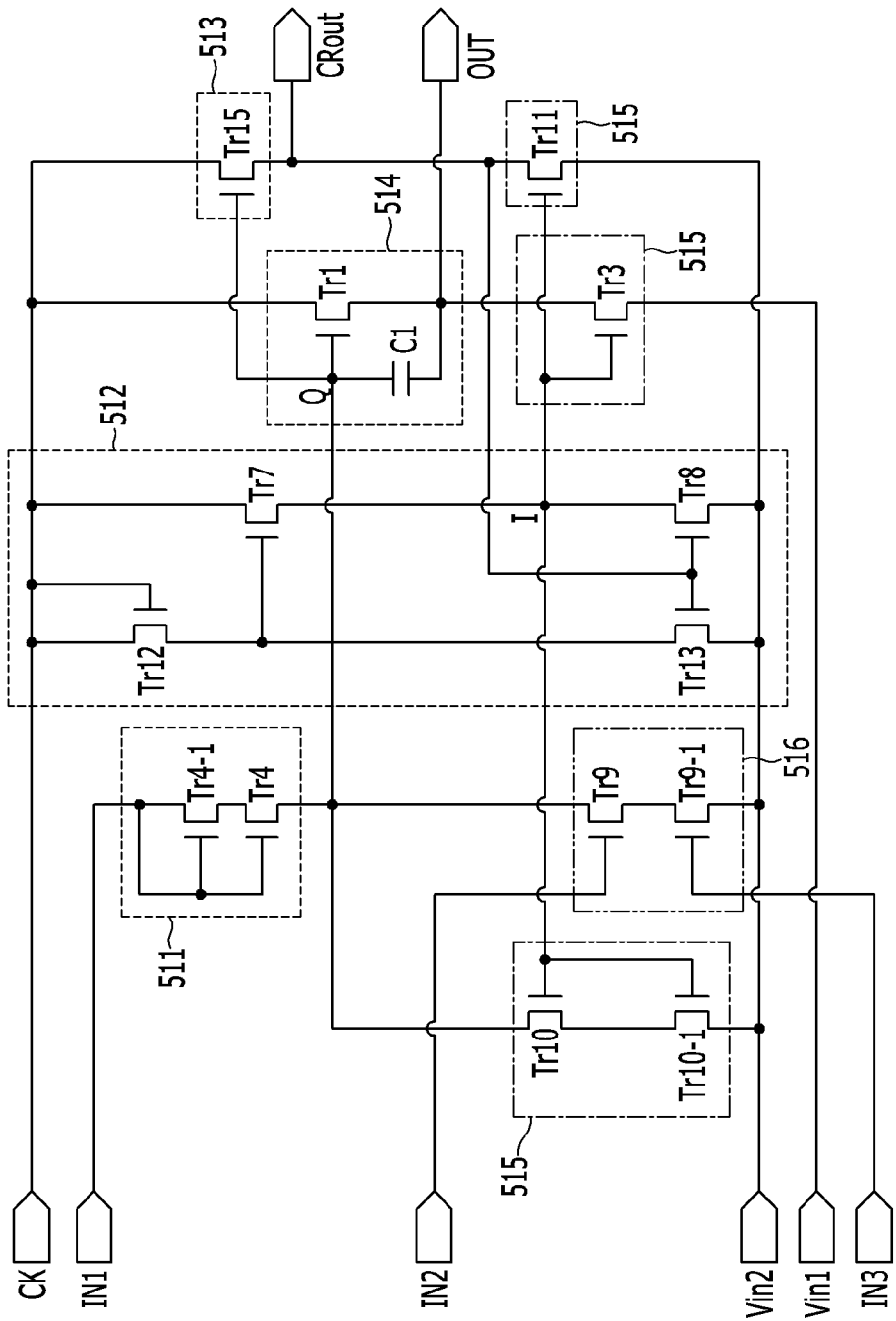
FIG. 10 is a partial enlarged circuit diagram of one exemplary embodiment of one stage of the gate driver according to the exemplary embodiment of FIG. 9.

FIG. 10 is a partial enlarged circuit diagram of one stage of the gate driver according to one exemplary embodiment of the exemplary embodiment of FIG. 9.

A stage to be described below is assumed to be the k-th stage.

Each stage SR of the first and second gate drivers 500 and 550 includes an input unit 511, an inverter unit 512, a transfer signal generator 513, an output unit 514, a noise remover 515, and a pull-down unit 516.

First, the input unit 511 includes at least one transistor (e.g., a fourth transistor Tr4).

In the illustrated exemplary embodiment, a first electrode and a gate electrode of the fourth transistor Tr4 are both coupled (diode-connected) to a first input terminal IN1, and a second electrode is coupled to a Q node (hereinafter also referred to as a first node).

When a high voltage is applied to the first input terminal IN1, the input unit 511 serves to transfer the high voltage to the Q node.

The inverter unit 512 includes four transistors (a twelfth transistor Tr12, a seventh transistor Tr7, an eighth transistor Tr8, and a thirteenth transistor Tr13).

First, input and gate electrodes of the twelfth transistor Tr12 are both coupled (diode-connected) to a clock input terminal CK, and a second electrode is coupled to a gate electrode of the seventh transistor Tr7 and a first electrode of the thirteenth transistor Tr13.

The gate electrode of the seventh transistor Tr7 is coupled to second electrode of the twelfth transistor Tr12, a first electrode of the seventh transistor Tr7 is coupled to the clock input terminal CK, and a second electrode of the seventh transistor Tr7 is coupled to an I node (referred to as an inverter node or second node).

A gate electrode of the eighth transistor Tr8 is coupled to a transfer signal output terminal CRout of the current stage, a first electrode of the eighth transistor Tr8 is coupled to the I node, and a second electrode of the eighth transistor Tr8 is coupled to a second voltage input terminal Vin2.

The first electrode of the thirteenth transistor Tr13 is couple to second electrode of the twelfth transistor Tr12, a gate electrode of the thirteenth transistor Tr13 is coupled to the transfer signal output terminal CRout of the current stage, and a second electrode of the thirteenth transistor Tr13 is coupled to the voltage input terminal Vin2.

According to a connection as described above, when a high-level clock signal is applied to the clock input terminal CK, a high-level signal is outputted to second electrode of the diode-connected twelfth transistor Tr12.

Then, as the high-level signal is input to the gate electrode of the seventh transistor Tr7 to output the high-level signal to second electrode of the seventh transistor Tr7, thereby converting a voltage level of the I node to a high level.

The transfer signal CR outputted from the transfer signal output terminal CRout of the current stage is applied to the gate electrodes of the thirteenth transistor Tr13 and the eighth transistor Tr8.

Then, the voltage of the I node coupled to the eighth transistor Tr8 is converted to the second low voltage VSS2, and the second low voltage VSS2 is applied to the gate electrode of the seventh transistor Tr7.

As a result, the I node of the inverter unit 512 has a voltage level that is of opposite polarity with respect to the transfer signal CR and the gate voltage that are outputted from the current stage.

In an exemplary embodiment, the transfer signal generator 513 includes one transistor (e.g., a fifteenth transistor Tr15).

A first electrode of the fifteenth transistor Tr15 is coupled to the clock input terminal CK, a gate electrode is coupled to an output of the input unit 511, that is, the Q node, and a second electrode is coupled to the transfer signal output terminal CRout that outputs the transfer signal CR.

In this case, a parasitic capacitor (not shown) may be provided between the gate electrode and the second electrode.

Second electrode of the fifteenth transistor Tr15 is coupled to the transfer signal output terminal CRout and a first electrode of the eleventh transistor Tr11.

The output unit 514 includes a first transistor Tr1 and a capacitor C1.

A gate electrode of the first transistor Tr1 is coupled to the Q node, a first electrode is coupled to the clock input terminal CK, and a second electrode is coupled to the gate voltage output terminal OUT and the pull-down unit 516.

A first electrode of the first capacitor C1 is coupled to the gate electrode of the first transistor Tr1, and a second electrode of the first capacitor C1 is coupled to second electrode of the first transistor Tr1.

The output unit 514 outputs the gate voltage to the gate voltage output terminal OUT depending on the voltage at the Q node and the signal applied to the clock input terminal CK.

In an exemplary embodiment, a voltage difference is generated between the control and output terminals of the first transistor Tr1 by the voltage that is applied to the Q node, for example.

When the voltage difference is stored in the capacitor C1 and the high-level clock signal is then applied to the first electrode of the first transistor Tr1, the charged voltage in the capacitor C1 is boosted up due to the coupling, and the gate voltage is outputted to the gate voltage output terminal OUT.

The noise remover 515 includes a third transistor Tr3, tenth and (10-1)-th transistors Tr10 and Tr10-1, and an eleventh transistor Tr11, and gate electrodes of the transistors Tr3, Tr10, Tr10-1, and Tr11 are respectively coupled to the I node.

A first electrode of the third transistor Tr3 is coupled to the second electrode of the first transistor Tr1, and a second electrode of the third transistor Tr3 is coupled to the first voltage input terminal Vin1.

The third transistor Tr3 transfers the first low voltage VSS1 to second electrode of the first transistor Tr1 according to the voltage of the I node, thereby converting the voltage of the gate voltage output terminal OUT to a low level.

In this case, second electrode of the third transistor Tr3 has been described to be coupled to the first voltage input terminal Vin1, but it may be coupled to the second voltage input terminal Vin2.

The second electrode of the tenth transistor Tr10 is coupled to a first electrode of the (10-1)-th transistor Tr10-1, and gate electrodes of the tenth transistor Tr10 and the (10-1)-th transistor Tr10-1 are both coupled to the I node.

A first electrode of the tenth transistor Tr10 is coupled to the Q node, and the second electrode of the (10-1)-th transistor Tr10-1 is coupled to the voltage input terminal Vin.

The tenth and (10-1)-th transistors Tr10 and Tr10-1 transfer the second low voltage VSS2 to the Q node according to the voltage of the I node.

Depending on the exemplary embodiments, the tenth and the (10-1)-th transistors Tr10 and Tr10-1 may be provided to have a structure in which three or more TFTs are connected.

The first electrode of the eleventh transistor Tr11 is coupled to second electrode of the fifteenth transistor Tr15, and a second electrode of the eleventh transistor Tr11 is coupled to the second voltage input terminal Vin2.

The eleventh transistor Tr11 transfers the second low voltage VSS2 to second electrode of the fifteenth transistor Tr15 according to the voltage of the I node, thereby converting a voltage level of the voltage transfer signal output terminal CRout to the low level.

The pull-down unit 516 includes a ninth transistor Tr9 and a (9-1)-th transistor Tr9-1.

The second electrode of the ninth transistor Tr9 is coupled to a first electrode of the (9-1)-th transistor Tr9-1.

A gate electrode of the ninth transistor Tr9 is coupled to the second input terminal IN2, and a first electrode of the ninth transistor Tr9 is coupled to the Q node. A gate electrode of the (9-1)-th transistor Tr9-1 is coupled to the third input terminal IN3, and the second electrode of the (9-1)-th transistor Tr9-1 is coupled to the second voltage input terminal Vin2.

Operations of the ninth transistor Tr9 and the (9-1)-th transistor Tr9-1 will be described with further reference to FIG. 4.

At the time t6, the transfer signal CR of the (k+2)-th stage applied to the ninth transistor Tr9 is at the high level, and the gate voltage of the (k+3)-th stage applied to the (9-1)-th transistor Tr9-1 is converted to the high level from the low level.

Then, since the high-level signal is applied to the gate electrodes of the ninth transistor Tr9 and the (9-1)-th transistor Tr9-1, the second low voltage VSS2 is transferred to the Q node.

That is, when the voltage of the Q node is at the high level, the transfer signal generator 513 and output unit 514 operate to output the high-level transfer signal CR and the high-level gate voltage at the k-th stage.

Then, after outputting the gate voltage that is output since the voltage of the Q node decreases to the voltage level that allows the first transistor Tr1 to operate, the second clock signal CKVB1 converted to the low level is applied to the first electrode of the first transistor Tr1.

Thus, second electrode of the first transistor Tr1, that is, the voltage of the gate voltage output terminal OUT, may be converted to the second clock signal CKVB1 at the low level.

Then, the k-th stage converts the voltage of the Q node to the low level by the high-level transfer signal CR outputted from the (k+2)-th stage, the high-level gate voltage outputted from the (k+3)-th stage, and the second low voltage VSS2.

When the voltage of the inverter node is converted to the high level according to the level of the clock signal, the noise remover 515 and the pull-down unit 516 operate to convert the transfer signal CR and the gate voltage to the low level.

Figure 11:
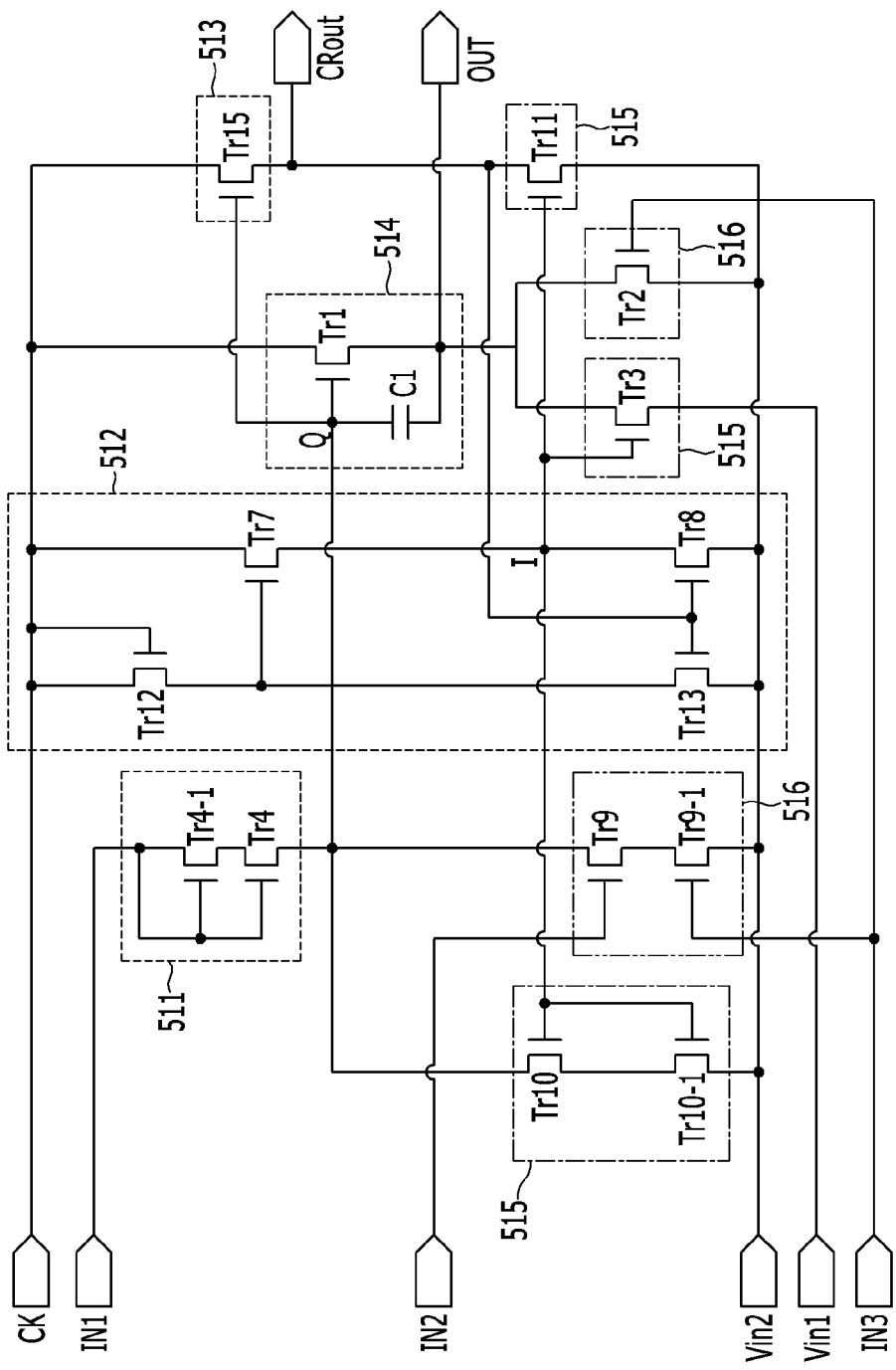
FIG. 11 is a partial enlarged circuit diagram of another exemplary embodiment of one stage of the gate driver according to the exemplary embodiment of FIG. 9.

FIG. 11 is a partial enlarged circuit diagram of one stage of the gate driver according to another exemplary embodiment of the exemplary embodiment of FIG. 9.

When compared with the exemplary embodiment of FIG. 10, the exemplary embodiment of FIG. 11 further includes a second transistor Tr2.

A gate electrode of the second transistor Tr2 is coupled to the third input terminal IN3.

A first electrode of the second transistor Tr2 is coupled to the gate voltage output terminal OUT, and a second electrode is coupled to the second voltage input terminal Vin2.

When the current stage is the k-th stage, the third input terminal IN3 receives, through the gate electrode of the second transistor Tr2, the transfer signal CR that is outputted from the (k+2)-th stage.

Then, the voltage of the gate voltage output terminal OUT coupled to the first electrode of the second transistor Tr2 is converted to the second low voltage VSS2 that is coupled to second electrode of the transistor Tr2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate driver comprising:
   a plurality of stages which respectively output gate signals to corresponding gate lines, and of which a stage includes:
   an input unit including a first transistor diode-connected to a first input terminal of the stage through a first node and biased by a first input signal of the first input terminal;
   an output unit including a second transistor including a gate electrode coupled to the first node, a first electrode coupled to a clock input terminal, and a second electrode coupled to a first output terminal of the stage;
   a capacitor coupled between the gate electrode and the second electrode of the second transistor; and
   a pull-down unit including a third transistor including a gate electrode coupled to a second input terminal of the stage, a first electrode coupled to the first node, and a second electrode coupled to a first voltage input terminal of the stage which receives a first voltage,
   wherein
   a second input signal of the second input terminal becomes an enable-level signal after a predetermined time is passed from a time when the second transistor outputs one cycle of the clock signal of the clock input terminal,
   wherein the predetermined time includes at least one fourth of a cycle of the clock signal.

2. The gate driver of claim 1, wherein the stage further comprises:
   a transfer signal generator including a fourth transistor including a gate electrode coupled to the first node, a first electrode coupled to the clock input terminal, and a second electrode coupled to a second output terminal of the stage.

3. The gate driver of claim 2, wherein the stage further comprises:
   an inverter unit including:
      a fifth transistor including a first electrode and a gate electrode coupled to the clock input terminal, and a second electrode which outputs the clock signal when being applied with the clock signal of the clock input terminal;
      a sixth transistor including a gate electrode coupled to the second electrode of the fifth transistor, a first electrode coupled to the clock input terminal, and a second electrode coupled to a second node; and
   a noise remover including a seventh transistor including a gate electrode coupled to the second node, a first electrode coupled to the second electrode of the second transistor, and a second electrode coupled to the first voltage input terminal.

4. The gate driver of claim 3, wherein
   the noise remover further includes an eighth transistor including a gate electrode coupled to the second node, a first electrode coupled to the second output terminal, and a second electrode coupled to the first voltage input terminal.

5. The gate driver of claim 4, wherein:
   the noise remover further includes a ninth transistor including a gate electrode coupled to the second node, a first electrode coupled to the first node, and a second electrode coupled to the first voltage input terminal.

6. The gate driver of claim 5, wherein
   the inverter unit further includes a tenth transistor including a gate electrode coupled to the second output terminal, a first electrode coupled to the second node, and a second electrode coupled to the first voltage input terminal.

7. The gate driver of claim 5, further comprising:
   the inverter unit further includes an eleventh transistor including a gate electrode coupled to the second output terminal, a first electrode coupled to the second electrode of the fifth transistor, and a second electrode coupled to the first voltage input terminal.

8. The gate driver of claim 4, wherein
   the pull-down unit further includes a twelfth transistor including a gate electrode coupled to a third input terminal of the stage, a first electrode coupled to the second electrode of the third transistor, and a second electrode coupled to the first voltage input terminal, and a third input signal of the third input terminal becomes the enable-level signal after the second transistor outputs the one cycle of the clock signal of the clock input terminal.

9. The gate driver of claim 1, wherein
the predetermined time is one fourth of a cycle of the clock signal.

10. The gate driver of claim 1, wherein
the second input signal is outputted to a first output terminal of another stage, and becomes the enable-level signal after the predetermined time is passed from the time when the second transistor outputs the one cycle of the clock signal of the clock input terminal.

11. The gate driver of claim 1, wherein
the second input signal is outputted to a second output terminal of another stage, and becomes the enable-level signal after the predetermined time is passed from the time when the second transistor outputs the one cycle of the clock signal of the clock input terminal.

12. The gate driver of claim 1, wherein
the first electrode of the third transistor is directly coupled to the first node.

13. The gate driver of claim 1, further comprising:
the pull-down unit further includes a thirteenth transistor including a gate electrode coupled to a fourth input terminal of the stage, a first electrode coupled to the first node, and a second electrode coupled to the first electrode of the third transistor, wherein
a fourth input signal of the fourth input terminal becomes the enable-level signal after the second transistor outputs the one cycle of the clock signal of the clock input terminal.

14. A display device comprising:
a display unit including a plurality of pixels coupled to corresponding gate lines; and
gate drivers including a plurality of stages which respectively outputs gate signals to the gate lines, and of which a stage includes:
an input unit including a first transistor diode-connected to a first input terminal of the stage through a first node and biased by a first input signal of the first input terminal of the stage;
an output unit including a second transistor including a gate electrode coupled to the first node, a first electrode coupled to a clock input terminal which receives a clock signal, and a second electrode coupled to a first output terminal of the stage;
a capacitor coupled between the gate electrode and the second electrode of the second transistor; and
a pull-down unit including a third transistor including a gate electrode coupled to a second input terminal of the stage, a first electrode coupled to the first node, and a second electrode coupled to a first voltage input terminal of the stage which receives a first voltage,
wherein
a second input signal of the second input terminal becomes an enable-level signal after a predetermined time is passed from a time when the second transistor outputs one cycle of the clock signal of the clock input terminal,
wherein the predetermined time includes at least one fourth of a cycle of the clock signal.

15. The display device of claim 14, wherein
the stage further includes a transfer signal generator including a fourth transistor including a gate electrode coupled to the first node, a first electrode coupled to the clock input terminal, and a second electrode coupled to a second output terminal of the stage.

16. The display device of claim 15, wherein
the stage further comprises an inverter unit including:
a fifth transistor including a first electrode and a gate electrode coupled to the clock input terminal, and a second electrode which outputs the clock signal when being applied with the clock signal of the clock input terminal; and
a sixth transistor including a gate electrode coupled to the second electrode of the fifth transistor, a first electrode coupled to the clock input terminal, and a second electrode coupled to a second node; and
a noise remover including a seventh transistor including a gate electrode coupled to the second node, a first electrode coupled to a second electrode of the second transistor, and a second electrode coupled to the first voltage input terminal.

17. The display device of claim 16, wherein
the noise remover further includes an eighth transistor including a gate electrode coupled to the second node, a first electrode coupled to the second output terminal, and a second electrode coupled to the first voltage input terminal.

18. The display device of claim 17, wherein
the noise remover further includes a ninth transistor including a gate electrode coupled to the second node, a first electrode coupled to the first node, and a second electrode coupled to the first voltage input terminal.

19. The display device of claim 18, wherein
the inverter unit further includes a tenth transistor including a gate electrode coupled to the second output terminal, a first electrode coupled to the second node, and a second electrode coupled to the first voltage input terminal.

20. The display device of claim 18, wherein
the inverter unit further includes an eleventh transistor including a gate electrode coupled to the second output terminal, a first electrode coupled to the second electrode of the fifth transistor, and a second electrode coupled to the first voltage input terminal.

21. The display device of claim 16, wherein
the pull-down unit further includes a twelfth transistor including a gate electrode coupled to a third input terminal of the stage, a first electrode coupled to the second electrode of the third transistor, and a second electrode coupled to the first voltage input terminal, and
a third input signal of the third input terminal becomes the enable-level signal after the second transistor outputs the one cycle of the clock signal of the clock input terminal.

22. The display device of claim 14, wherein
the predetermined time is one fourth of a cycle of the clock signal.

23. The display device of claim 14, wherein
the second input signal is outputted to a first output terminal of another stage and becomes the enable-level signal after the predetermined time is passed from the time when the second transistor outputs the one cycle of the clock signal of the clock input terminal.

24. The display device of claim 14, wherein
the second input signal is outputted to a second output terminal of another stage, and becomes the enable-level signal after the predetermined time is passed from the time when the second transistor outputs the one cycle of the clock signal of the clock input terminal.

25. The display device of claim 14, wherein
the first electrode of the third transistor is directly coupled to the first node.

26. The display device of claim 14, wherein
the pull-down unit further includes a thirteenth transistor including a gate electrode coupled to a third input terminal of the stage, a first electrode coupled to the second electrode of the third transistor, and a second electrode coupled to the first voltage input terminal, and
a third input signal of the third input terminal becomes the enable-level signal after the second transistor outputs the one cycle of the clock signal of the clock input terminal.

* * * * *